(12) United States Patent
Zinck

(10) Patent No.: US 12,148,980 B2
(45) Date of Patent: Nov. 19, 2024

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Christophe Zinck, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 542 days.

(21) Appl. No.: 17/351,056

(22) Filed: Jun. 17, 2021

(65) Prior Publication Data
US 2022/0407215 A1    Dec. 22, 2022

(51) Int. Cl.
*H01Q 1/22*    (2006.01)
*H01L 23/31*    (2006.01)
*H01L 23/66*    (2006.01)
*H01P 3/08*    (2006.01)

(52) U.S. Cl.
CPC ....... *H01Q 1/2283* (2013.01); *H01L 23/3128* (2013.01); *H01L 23/66* (2013.01); *H01P 3/08* (2013.01); *H01L 2223/6627* (2013.01); *H01L 2223/6677* (2013.01)

(58) Field of Classification Search
CPC .......... H01Q 1/2283; H01L 2223/6627; H01L 23/66; H01L 2223/6677; H01P 3/08; H01P 3/12; H01P 3/121
See application file for complete search history.

(56) References Cited

U.S. PATENT DOCUMENTS

| 10,103,447 B2 | 10/2018 | Tong et al. | |
| 2009/0256752 A1* | 10/2009 | Akkermans | H01Q 1/2283 343/700 MS |
| 2012/0086114 A1* | 4/2012 | Zhao | H01Q 9/045 257/692 |
| 2015/0364830 A1* | 12/2015 | Tong | H01Q 23/00 342/27 |

* cited by examiner

*Primary Examiner* — Tucker J Wright
(74) *Attorney, Agent, or Firm* — FOLEY & LARDNER LLP

(57) ABSTRACT

The present disclosure provides a semiconductor device package including a substrate, a waveguide component, and an antenna pattern. The substrate includes a feeding element. The waveguide component is disposed over the substrate. The antenna pattern is disposed over the substrate. The waveguide component is substantially aligned with the feeding element and the antenna pattern.

16 Claims, 28 Drawing Sheets

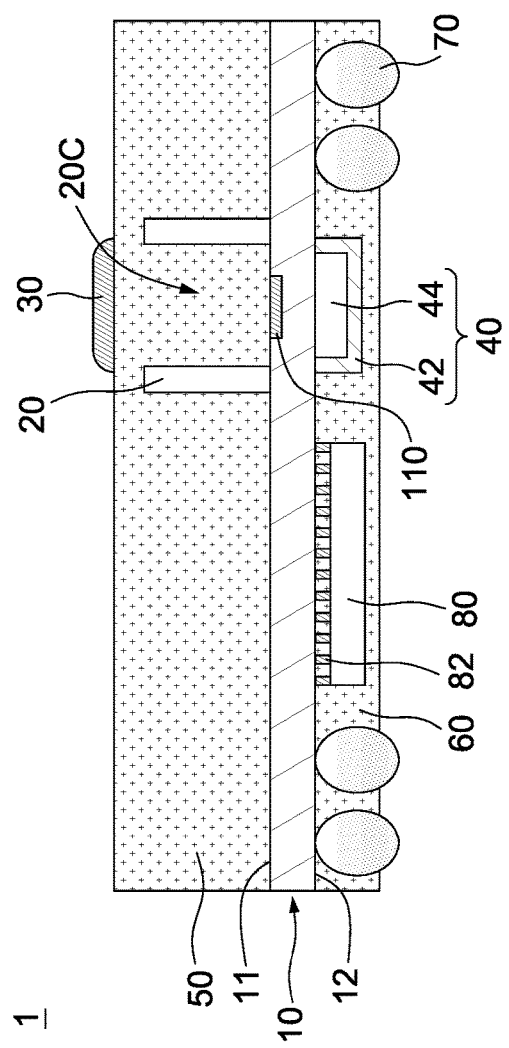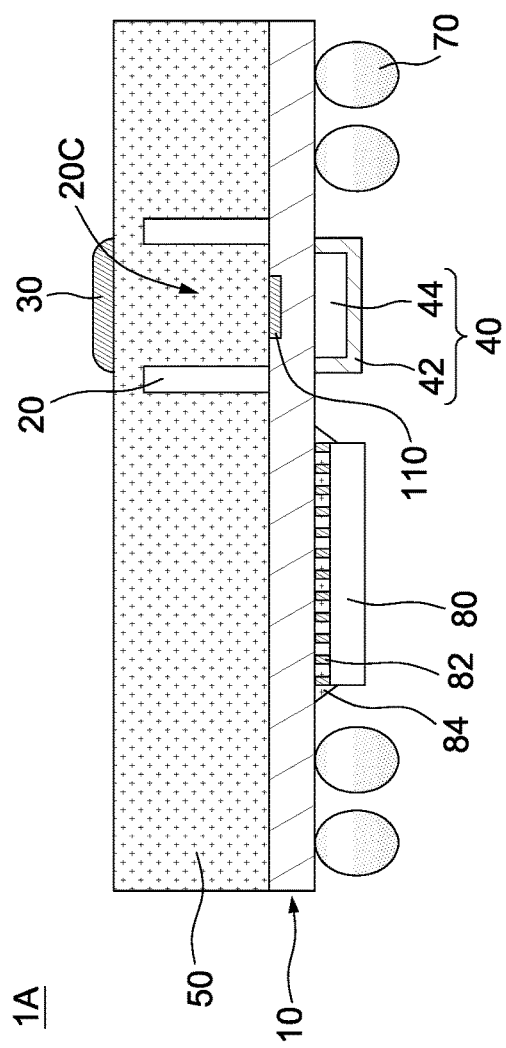
FIG. 1
FIG. 1A

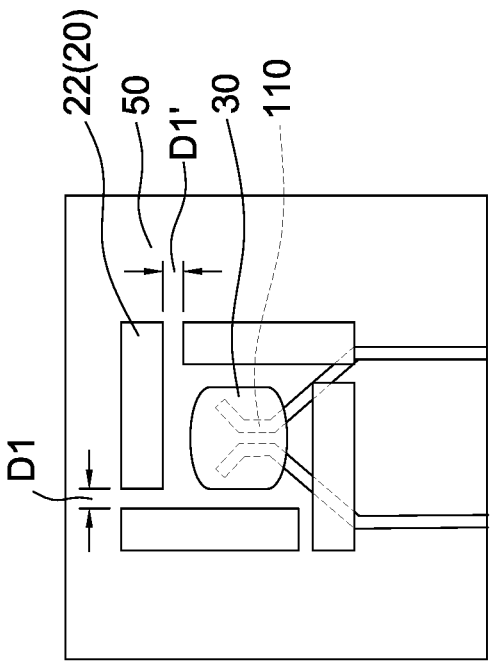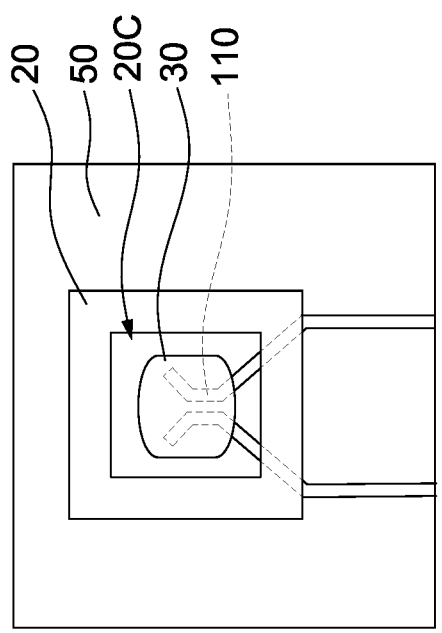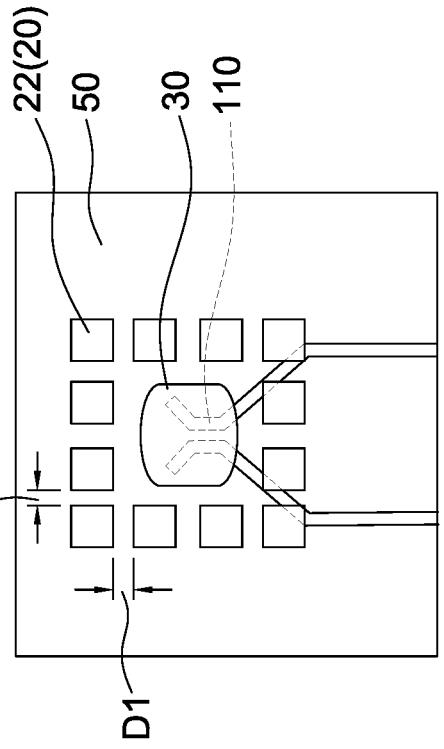
FIG. 3A
FIG. 3B
FIG. 3C

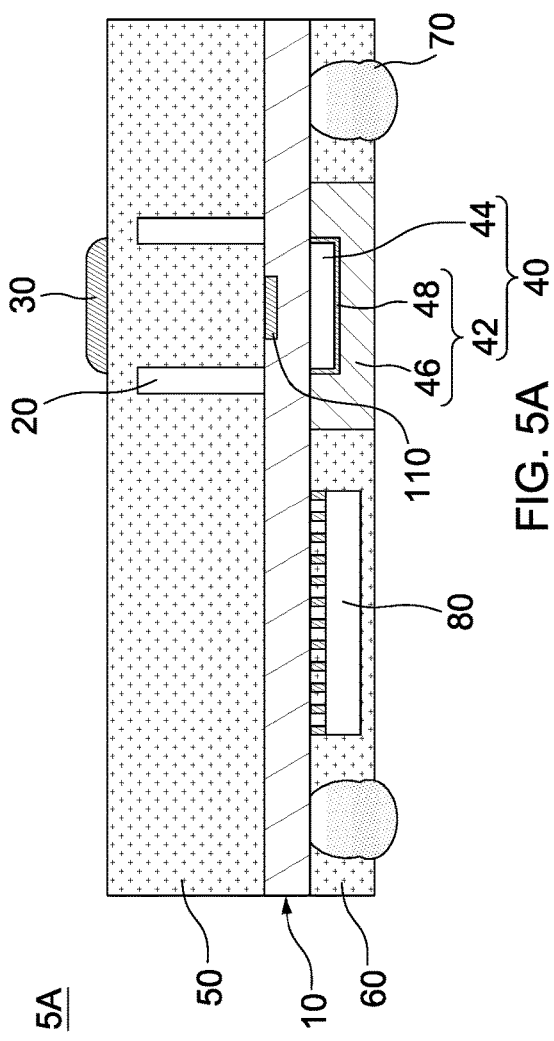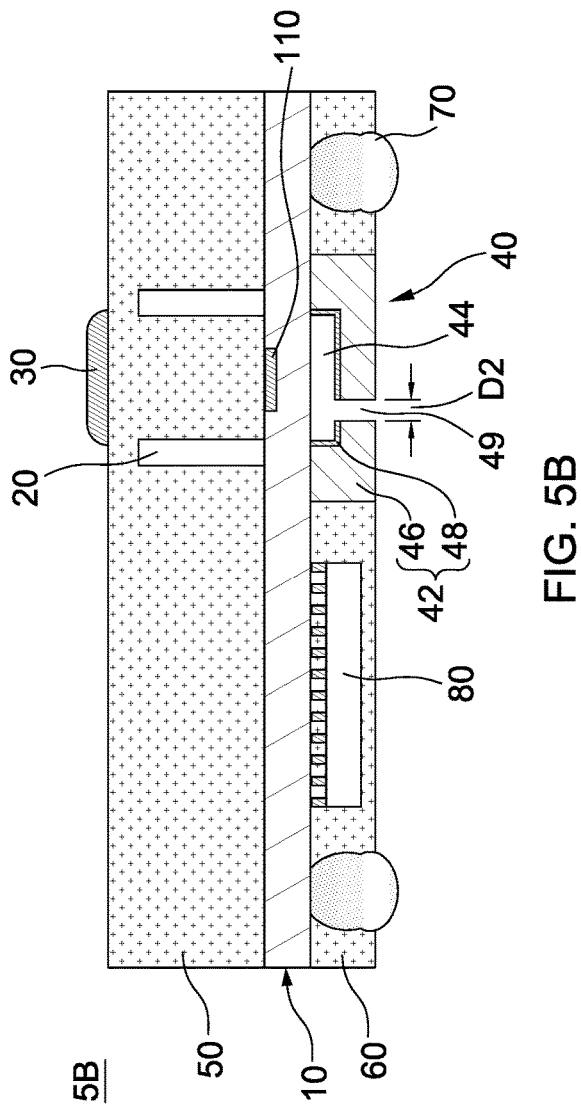

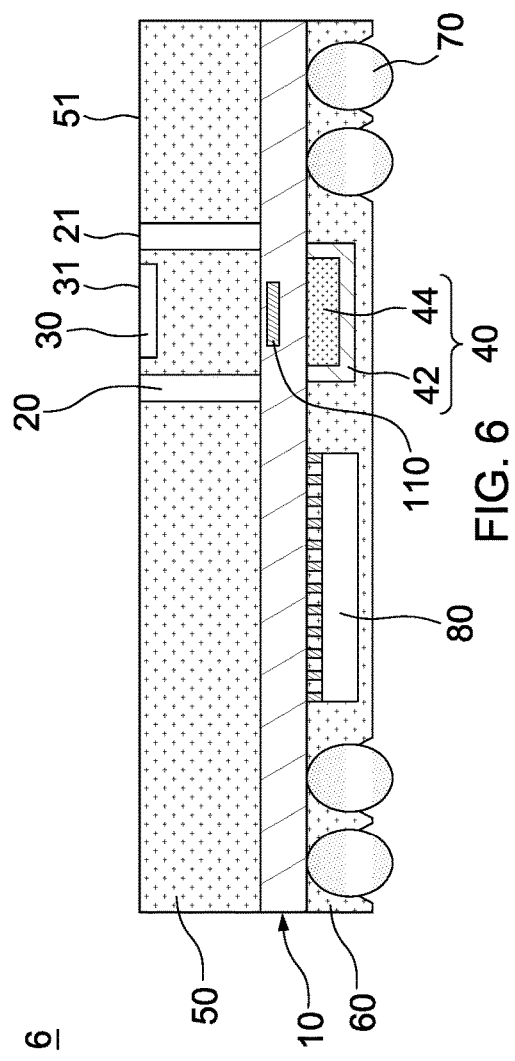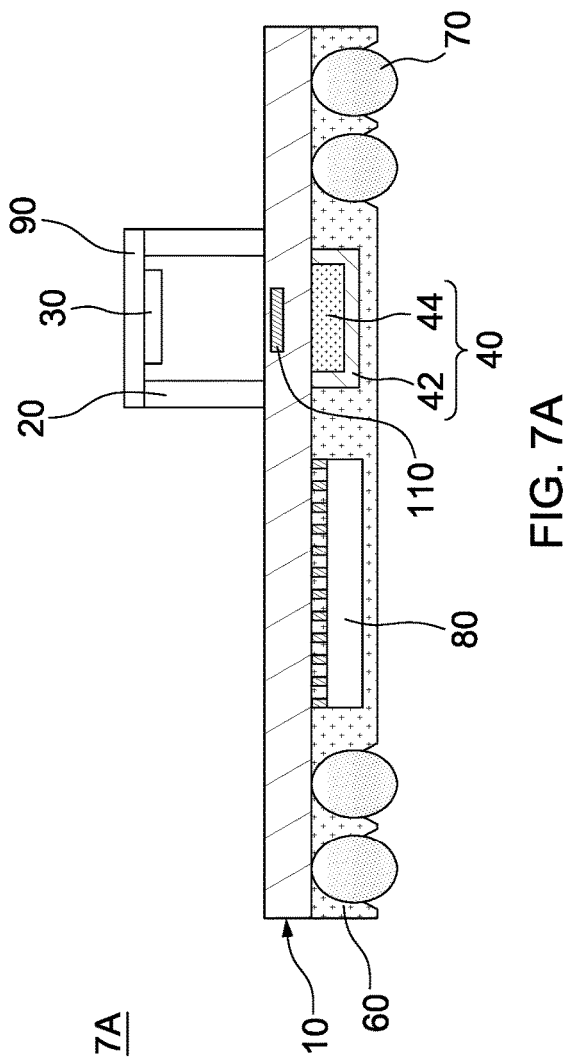

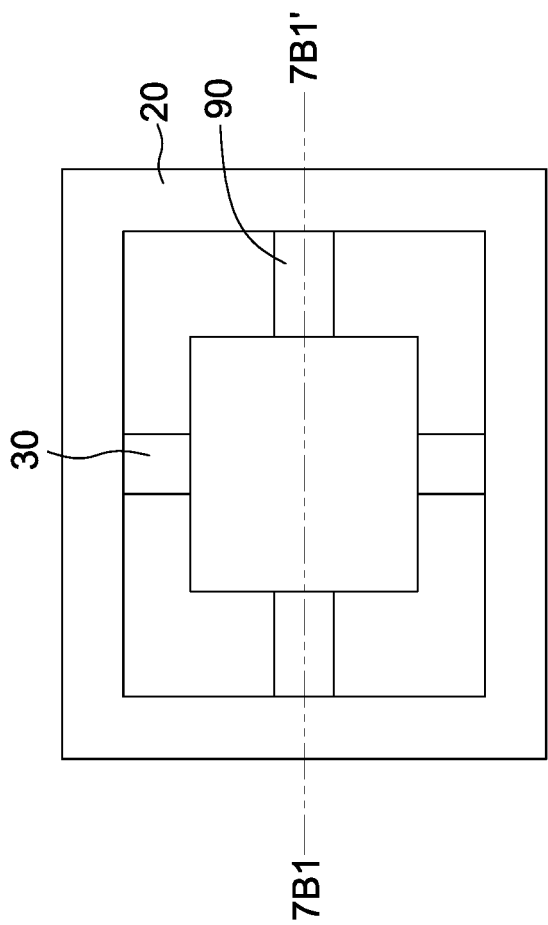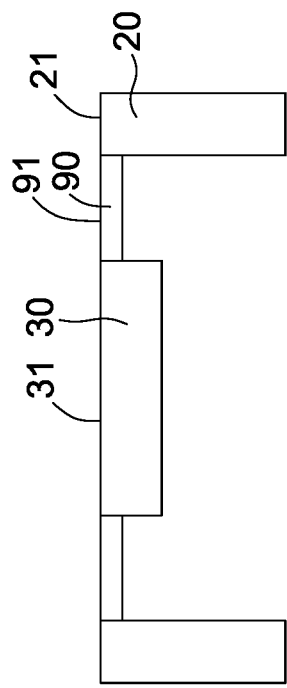
FIG. 7B1    FIG. 7B2

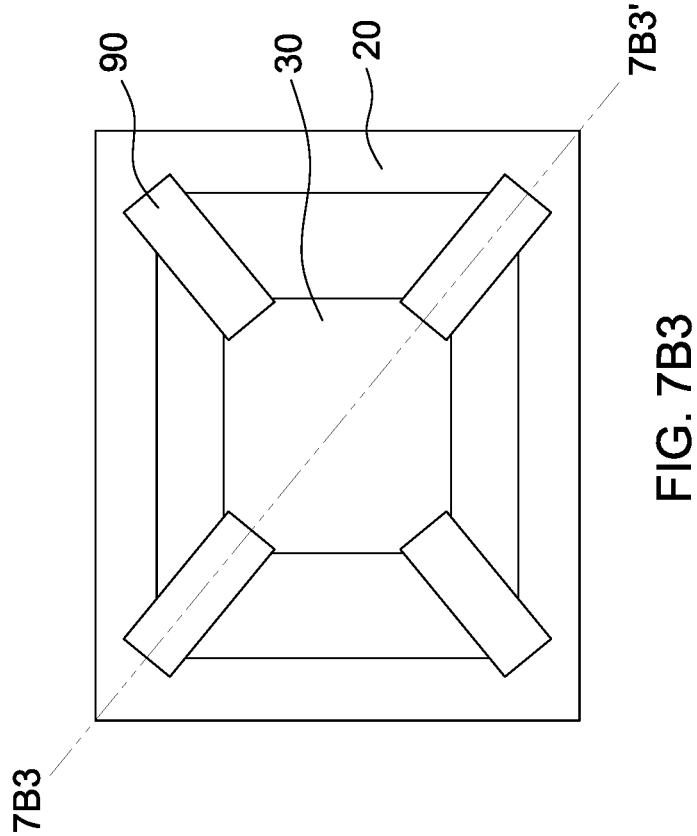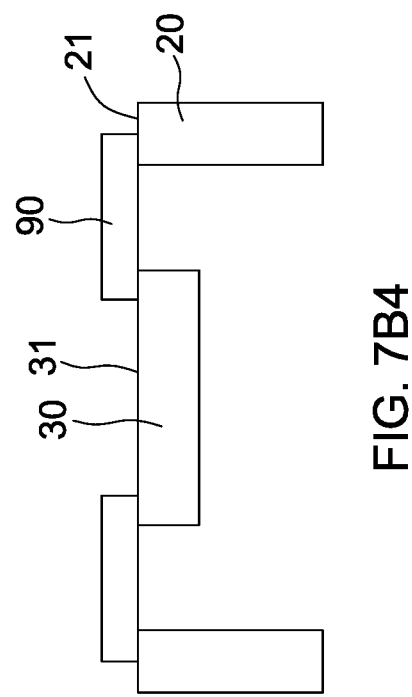
FIG. 7B3
FIG. 7B4

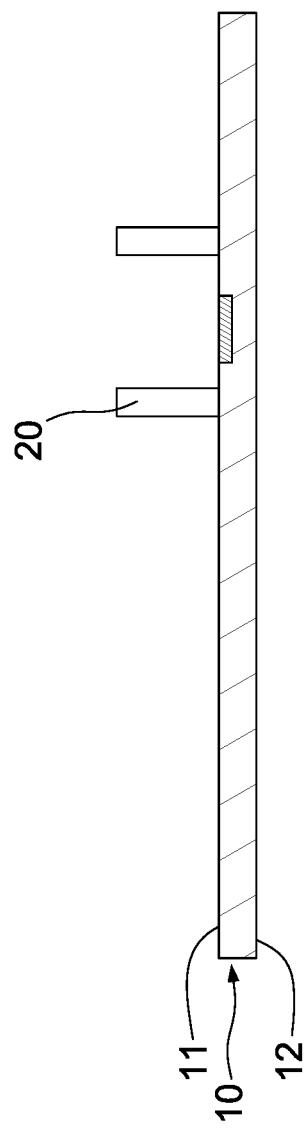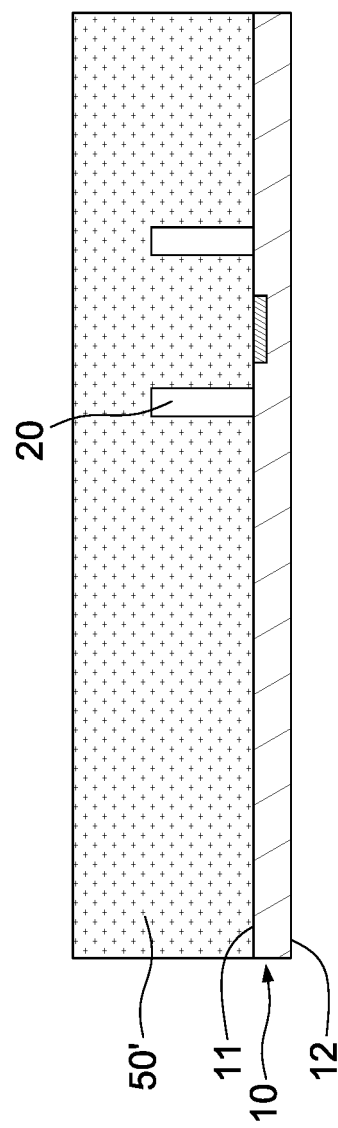

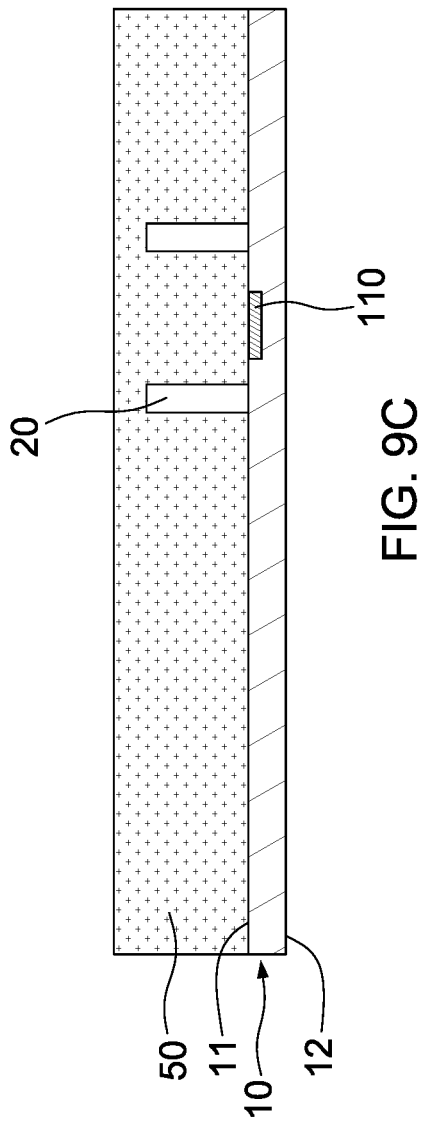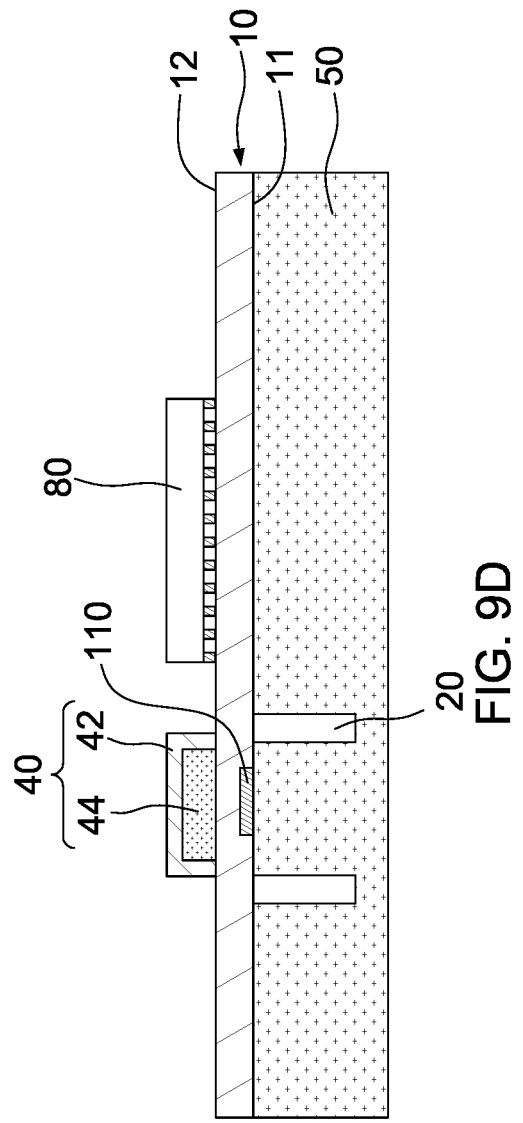

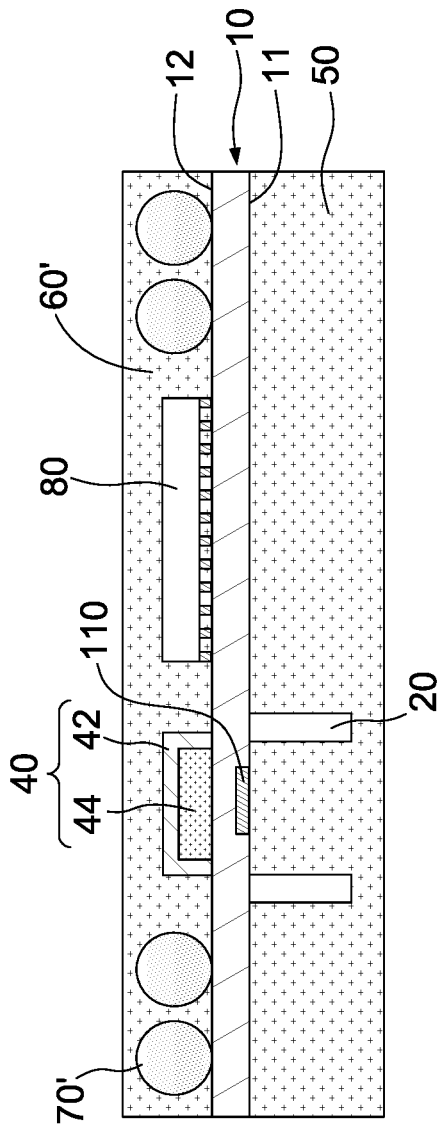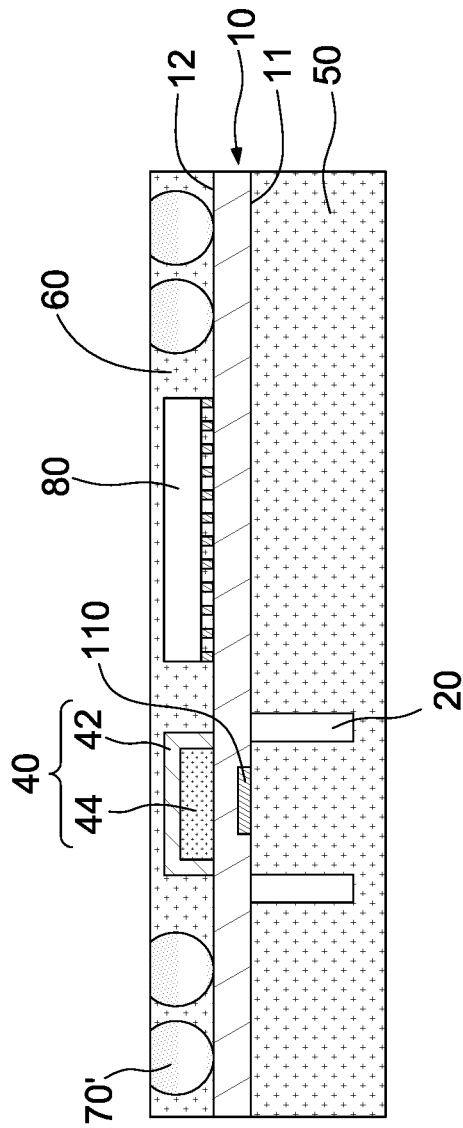

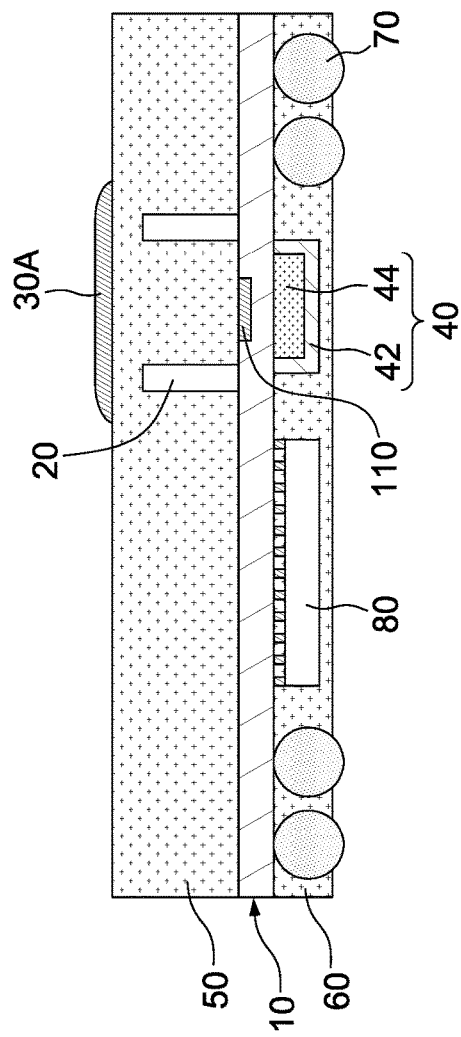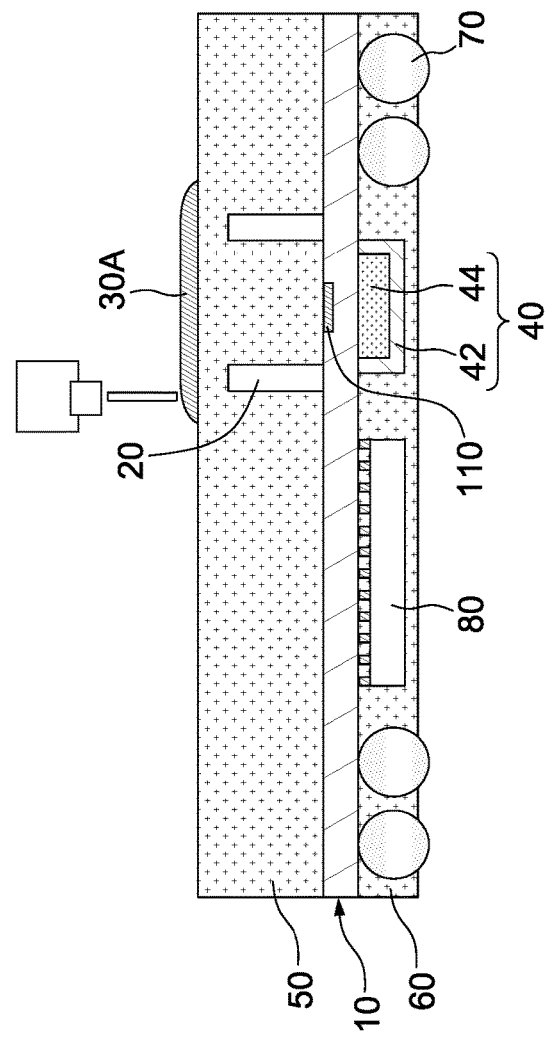

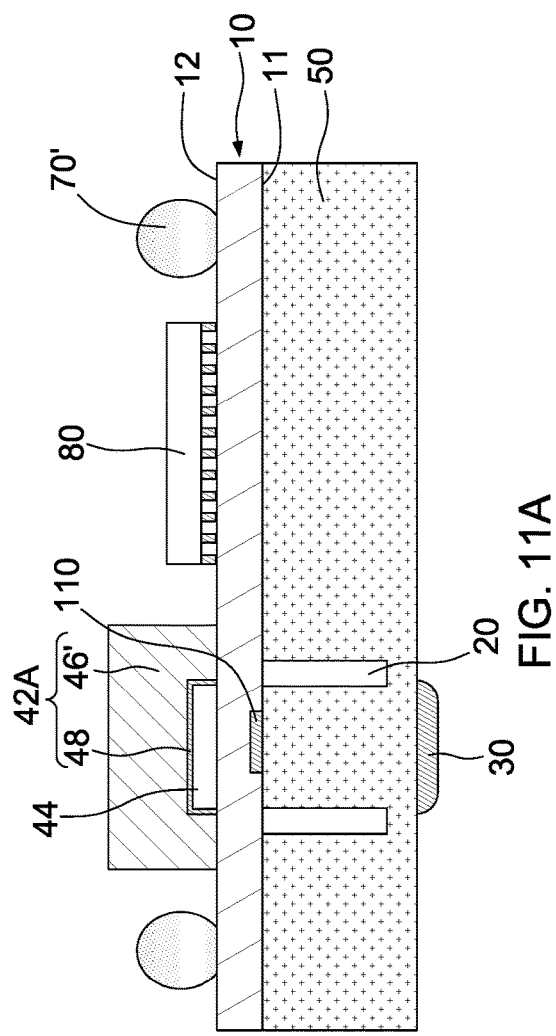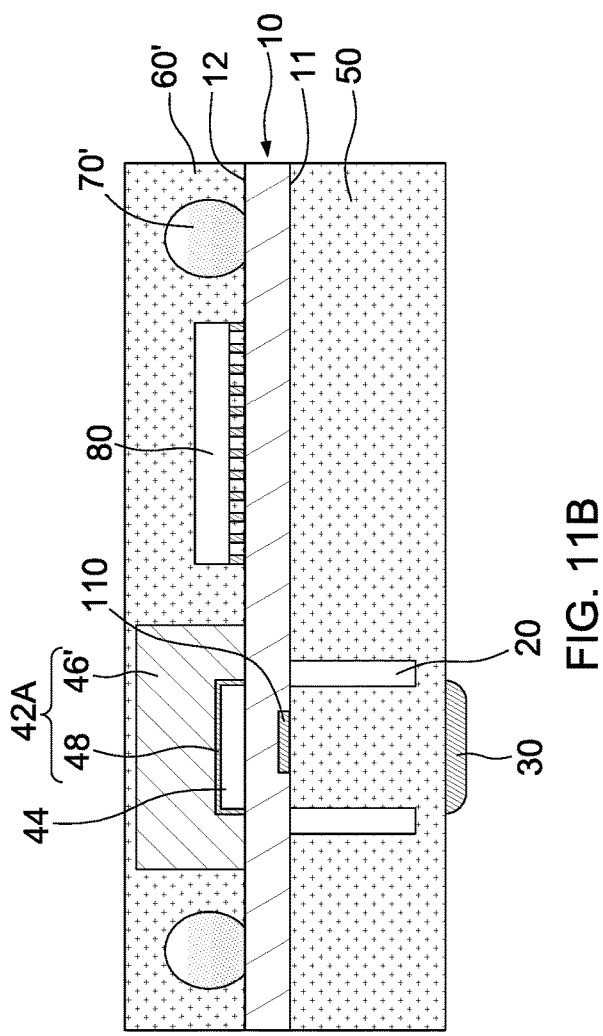

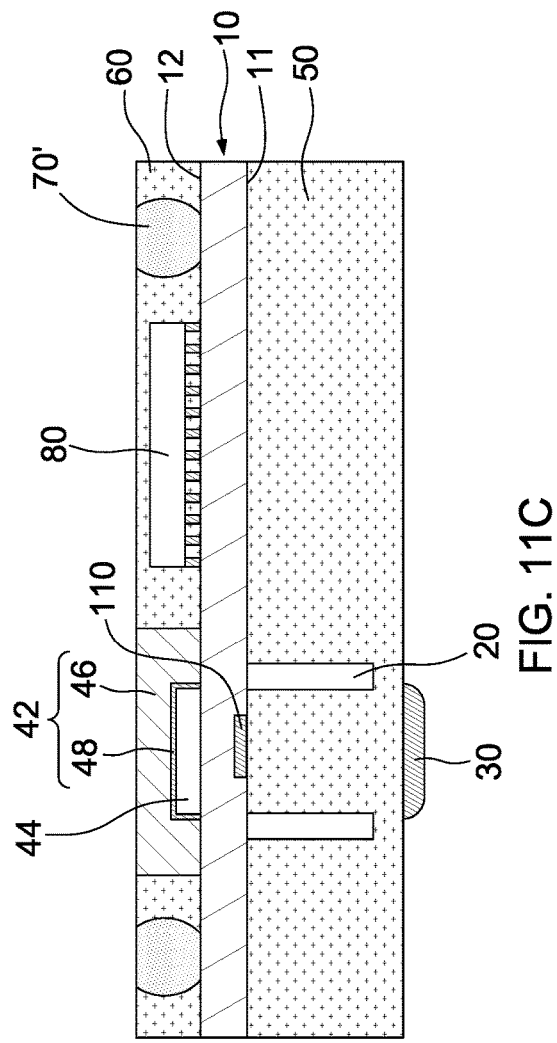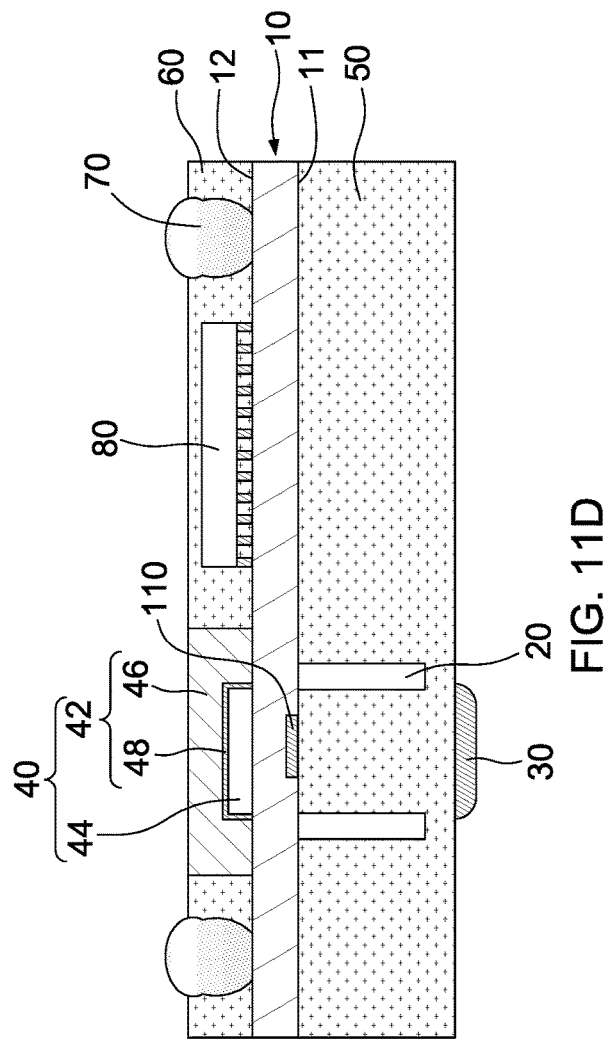

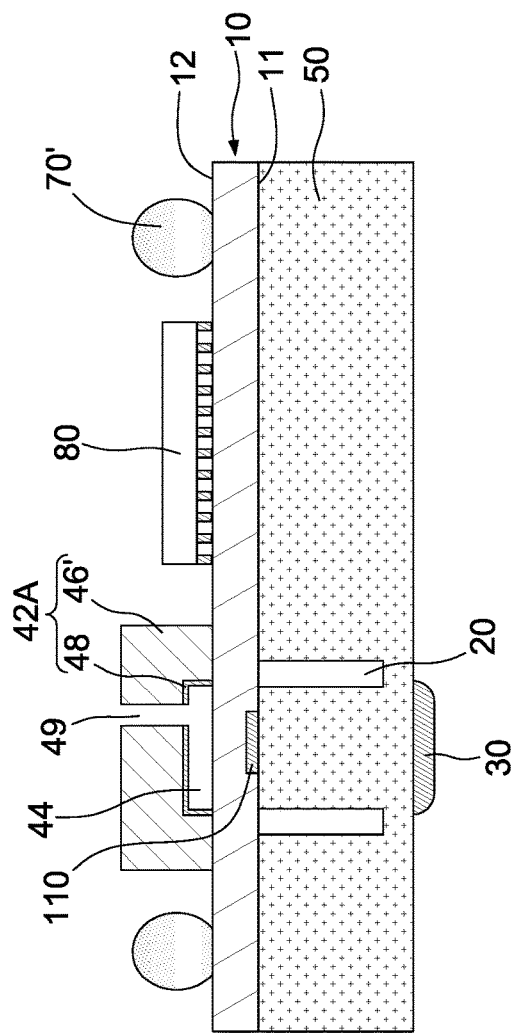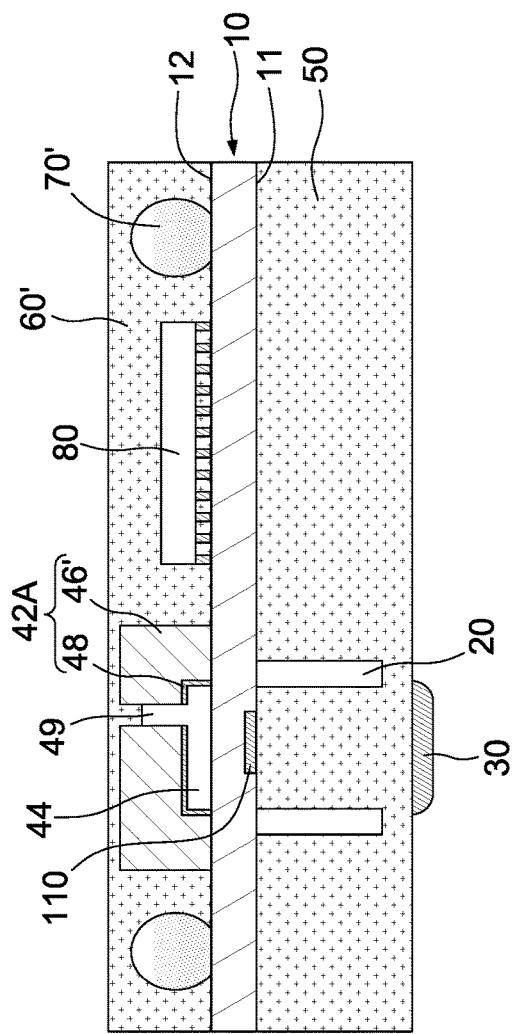

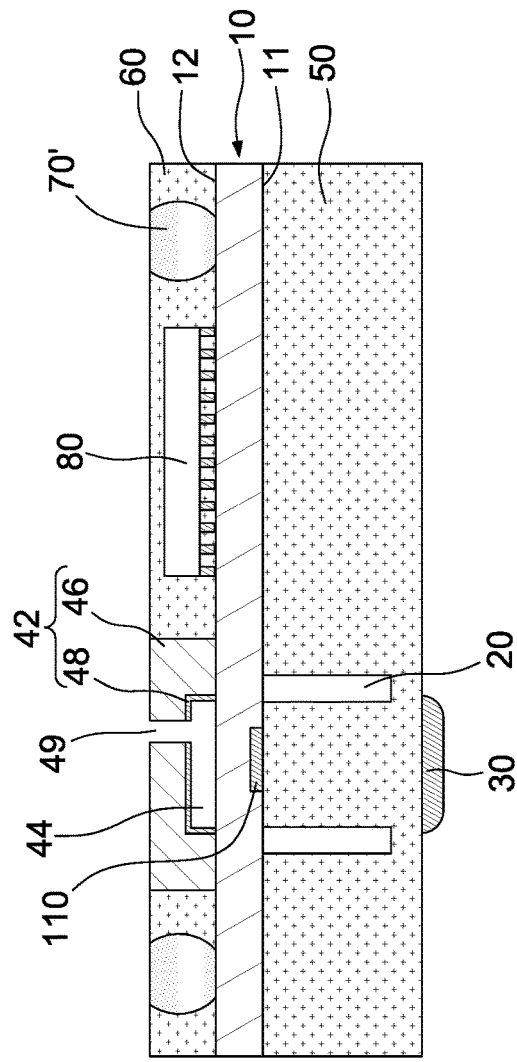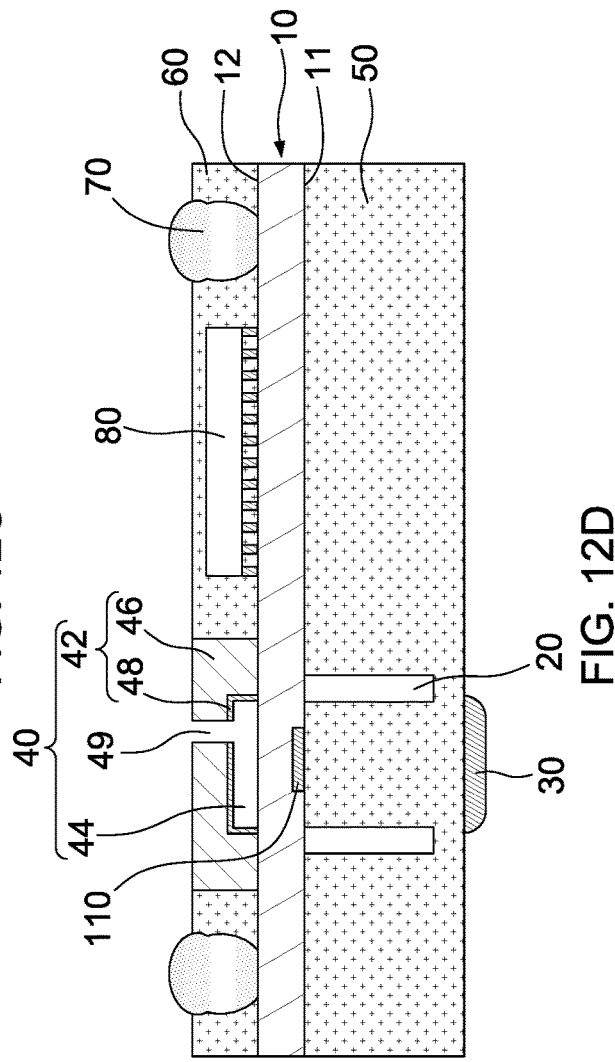

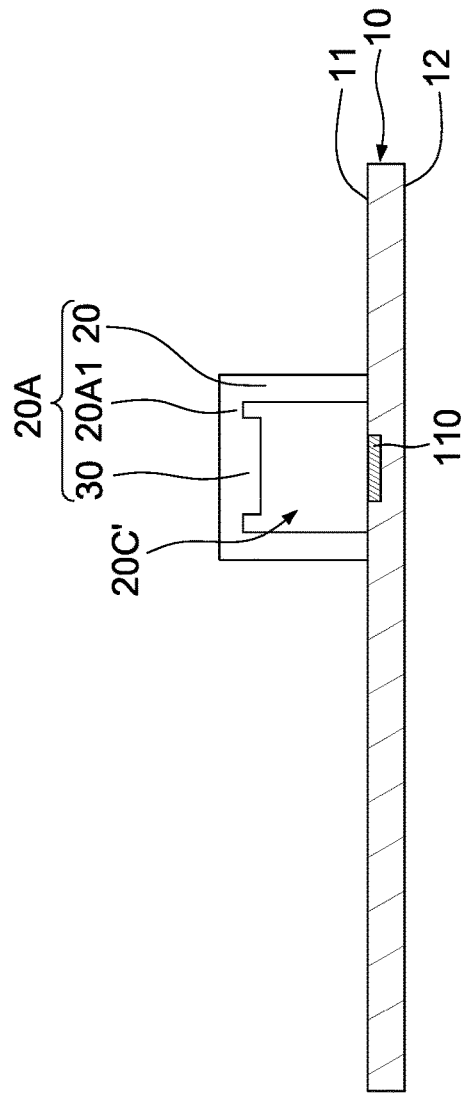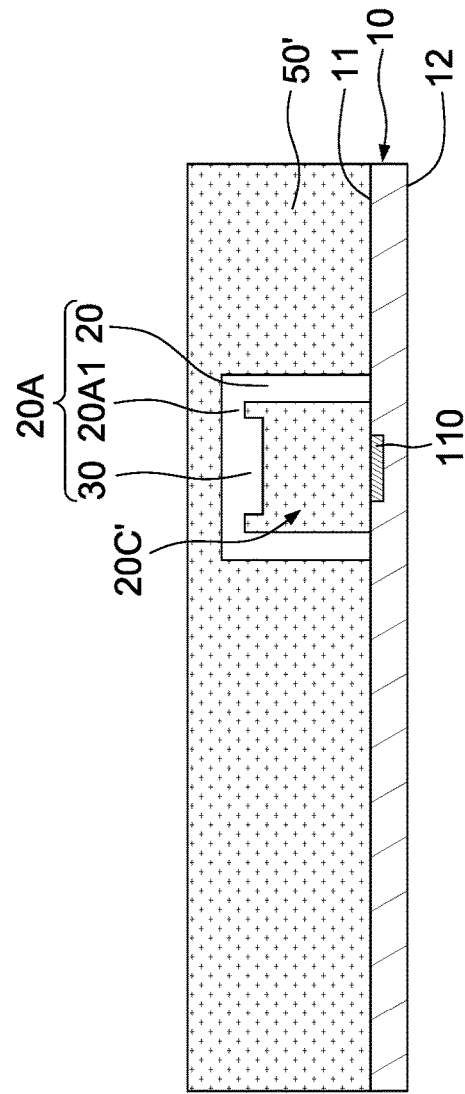

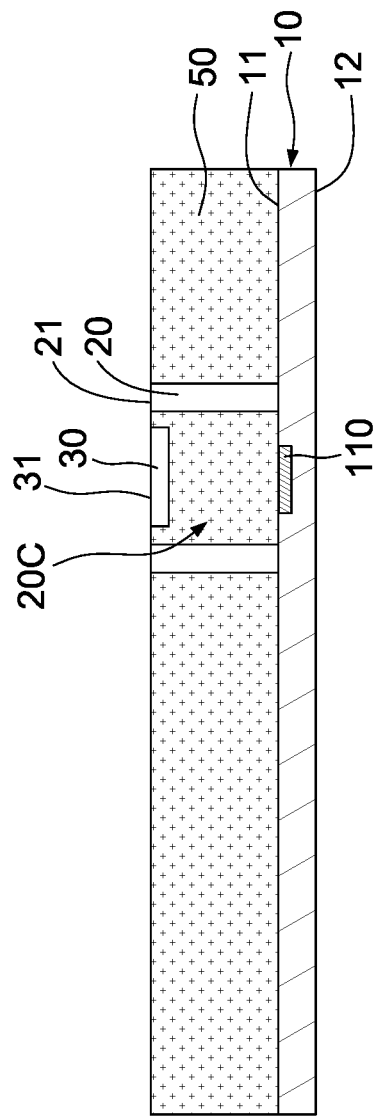
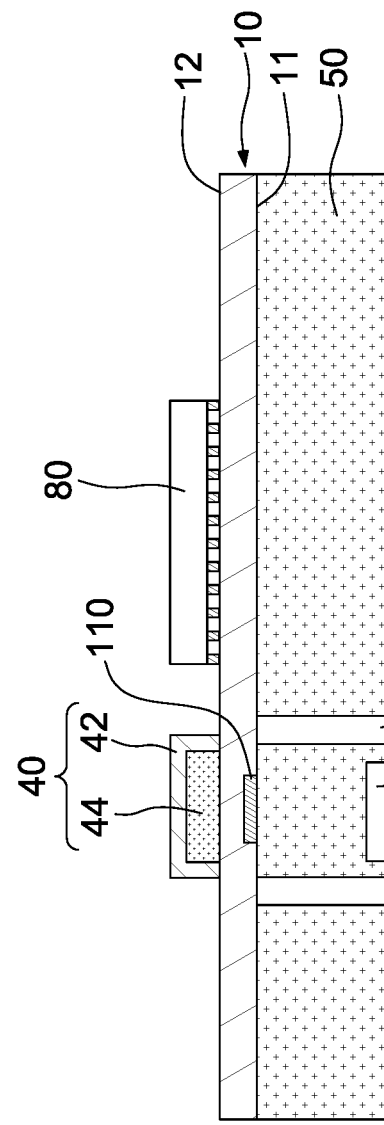
FIG. 13C
FIG. 13D

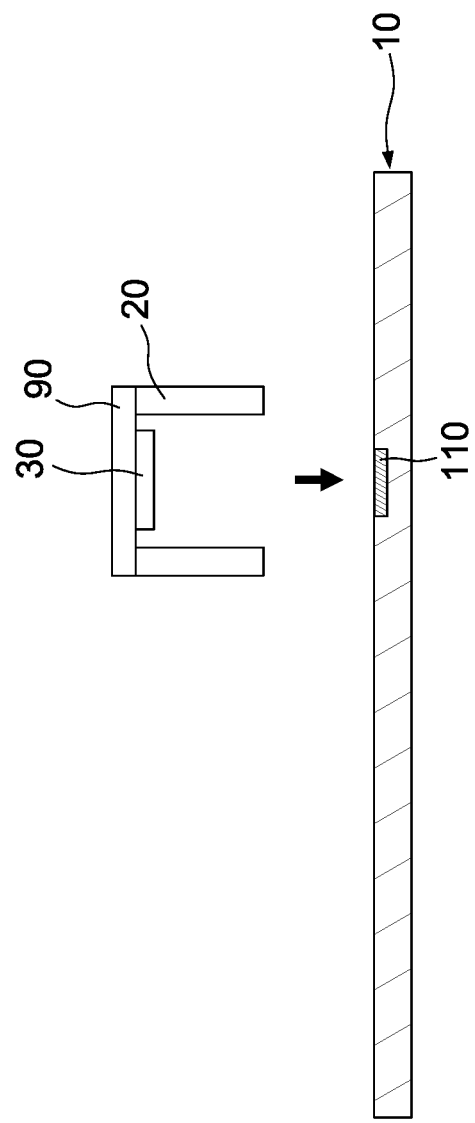

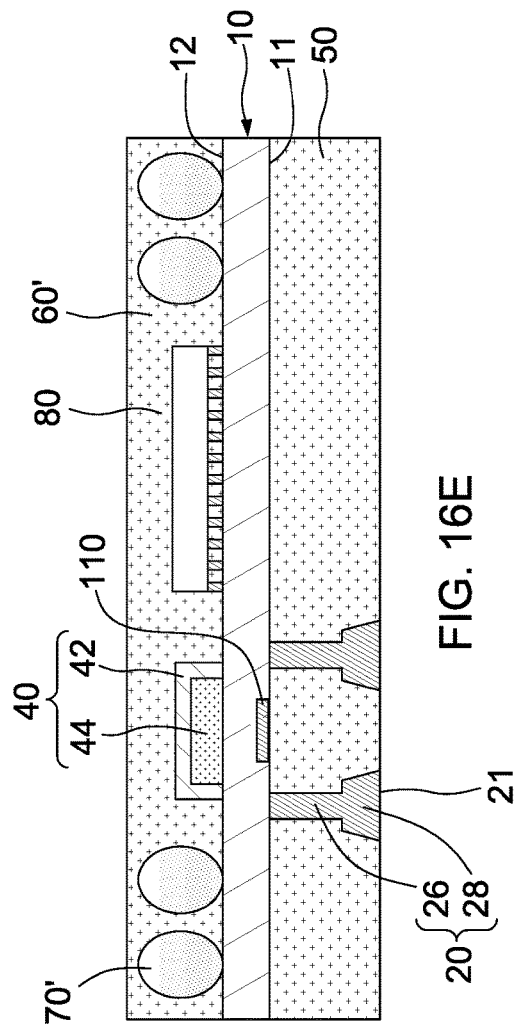
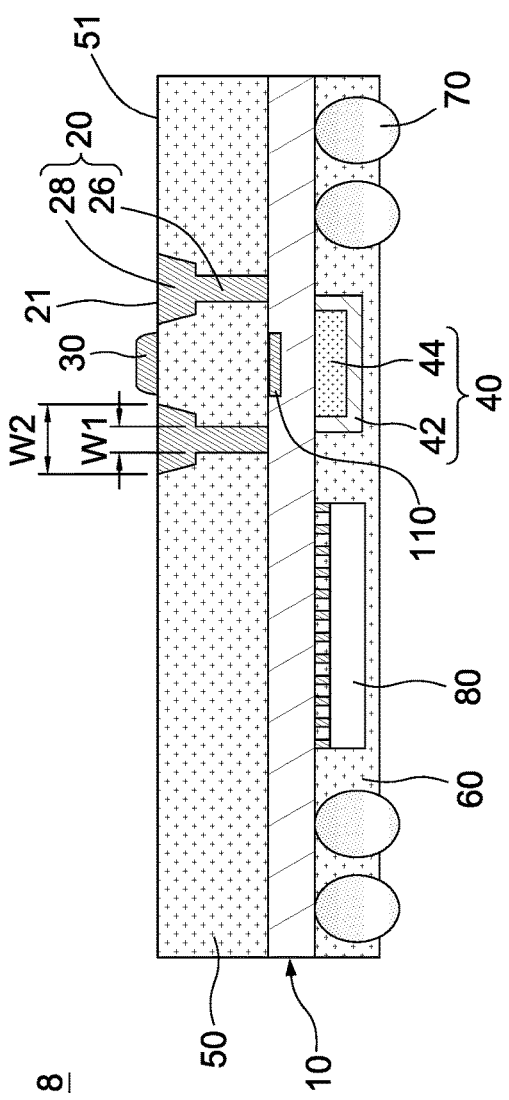

SEMICONDUCTOR DEVICE PACKAGE AND METHOD OF MANUFACTURING THE SAME

BACKGROUND

1. Technical Field

The present disclosure generally relates to a semiconductor device package, and particularly to a semiconductor device package including a waveguide component.

2. Description of the Related Art

Wireless communication devices typically include antennas for transmitting and receiving radio frequency (RF) signals that can be integrated with radio frequency integrated circuit (RFIC) chips in package structures. Current hybrid antenna-in-package (AiP) structures often utilize relatively complex manufacturing processes, including one or more selective molding operations. When heterogeneous materials are integrated, however, lamination shift issues may occur.

SUMMARY

In one or more embodiments, a semiconductor device package includes a substrate, a waveguide component, and an antenna pattern. The substrate includes a feeding element. The waveguide component is disposed over the substrate. The antenna pattern is disposed over the substrate. The waveguide component is substantially aligned with the feeding element and the antenna pattern.

In one or more embodiments, a semiconductor device package includes a substrate, a waveguide component, a first encapsulant, and a second encapsulant. The substrate includes a first surface and a second surface opposite to the first surface. The waveguide component is at least partially disposed over the first surface of the substrate. The first encapsulant encapsulates the first surface of the substrate and the waveguide component. The second encapsulant encapsulates the second surface of the substrate.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 1 illustrates a cross-sectional view of a semiconductor device package, in accordance with some embodiments of the present disclosure.

FIG. 1A illustrates a cross-sectional view of a semiconductor device package, in accordance with some embodiments of the present disclosure.

FIG. 3A illustrates a cross-sectional view of a portion of a semiconductor device package, in accordance with some embodiments of the present disclosure.

FIG. 3B illustrates a cross-sectional view of a portion of a semiconductor device package, in accordance with some embodiments of the present disclosure.

FIG. 3C illustrates a cross-sectional view of a portion of a semiconductor device package, in accordance with some embodiments of the present disclosure.

FIG. 5A illustrates a cross-sectional view of a semiconductor device package, in accordance with some embodiments of the present disclosure.

FIG. 5B illustrates a cross-sectional view of a semiconductor device package, in accordance with some embodiments of the present disclosure.

FIG. 6 illustrates a cross-sectional view of a semiconductor device package, in accordance with some embodiments of the present disclosure.

FIG. 7A illustrates a cross-sectional view of a semiconductor device package, in accordance with some embodiments of the present disclosure.

FIG. 7B1 illustrates a top view of a portion of a semiconductor device package, in accordance with some embodiments of the present disclosure.

FIG. 7B2 illustrates a cross-sectional view of a portion of a semiconductor device package, in accordance with some embodiments of the present disclosure.

FIG. 7B3 illustrates a top view of a portion of a semiconductor device package, in accordance with some embodiments of the present disclosure.

FIG. 7B4 illustrates a cross-sectional view of a portion of a semiconductor device package, in accordance with some embodiments of the present disclosure.

FIG. 9A, FIG. 9B, FIG. 9C, FIG. 9D, FIG. 9E, FIG. 9F, and FIG. 9G illustrate one or more stages of a method of manufacturing a semiconductor device package in accordance with some embodiments of the present disclosure.

FIG. 10A, FIG. 10B, and FIG. 10C illustrate one or more stages of a method of manufacturing a semiconductor device package in accordance with some embodiments of the present disclosure.

FIG. 11A, FIG. 11B, FIG. 11C, and FIG. 11D illustrate one or more stages of a method of manufacturing a semiconductor device package in accordance with some embodiments of the present disclosure.

FIG. 12A, FIG. 12B, FIG. 12C, and FIG. 12D illustrate one or more stages of a method of manufacturing a semiconductor device package in accordance with some embodiments of the present disclosure.

FIG. 13A, FIG. 13B, FIG. 13C, FIG. 13D, FIG. 13E, and FIG. 13F illustrate one or more stages of a method of manufacturing a semiconductor device package in accordance with some embodiments of the present disclosure.

FIG. 15 illustrates one or more stages of a method of manufacturing a semiconductor device package in accordance with some embodiments of the present disclosure.

FIG. 16A, FIG. 16B, FIG. 16C, FIG. 16D, FIG. 16E, and FIG. 16F illustrate one or more stages of a method of manufacturing a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 2:
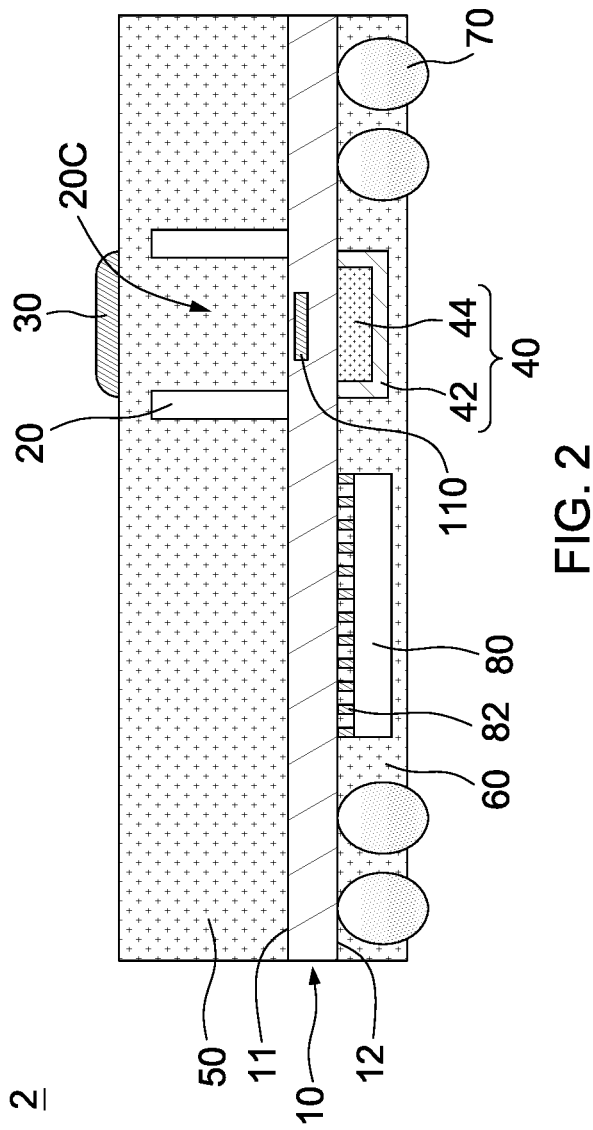
FIG. 2 illustrates a cross-sectional view of a semiconductor device package, in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a cross-sectional view of a semiconductor device package 1, in accordance with some embodiments of the present disclosure. The semiconductor device package 1 includes a substrate 10, a waveguide component 20, an antenna pattern 30, a reflector 40, encapsulants 50 and 60, connection elements 70, and an electronic component 80.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, including such as a plurality of conductive traces and/or conductive traces through vias. The substrate 10 may include a redistribution layer (RDL) and/or a grounding element. In some embodiments, the substrate 10 may include an organic substrate or a leadframe. The substrate 10 may be a single-layer substrate or a multi-layer substrate. In some embodiments, the substrate 10 may include a two-layer structure which includes a core layer and a conductive material and/or structure disposed on an upper surface and a bottom surface of the substrate 10. The conductive material and/or structure may include a plurality of traces. The substrate 10 may have a surface 11 and a surface 12 opposite to the surface 11. In some embodiments, the substrate 10 includes a feeding element 110. In some embodiments, the feeding element 110 may be in proximity to, adjacent to, or embedded in and exposed from the surface 11 of the substrate 10. For example, the feeding element 110 can be exposed from the surface 11 of the substrate 10, as shown in FIG. 1.

The waveguide component 20 may be disposed over the substrate 10. In some embodiments, the waveguide component 20 is disposed on the surface 11 of the substrate 10. In some embodiments, the waveguide component 20 is made of or includes a conductive material. In some embodiments, the waveguide component 20 is made of or includes a metal material. The waveguide component 20 includes a waveguide channel 20C configured to propagate electromagnetic waves (or signals) between two ends of the waveguide channel 20C. The waveguide component 20 is advantageous in reducing radiation losses of the electromagnetic waves (or signals) toward lateral sides of the waveguide component 20. In some embodiments, the waveguide component 30 includes a ring structure defining the waveguide channel 20C. In some embodiments, the waveguide component 20 is spaced apart from the feeding element 110 of the substrate 10. In some embodiments, the feeding element 110 is disposed within a projection of the waveguide channel 20C on the substrate 10.

The antenna pattern 30 may be disposed over the substrate 10. In some embodiments, the antenna pattern 30 includes a conductive layer, such as a metal patch, and the conductive layer may function as a director. In some embodiments, the waveguide component 20 is substantially aligned with the feeding element 110 and the antenna pattern 30. In some embodiments, the waveguide channel 20C of the waveguide component 20 is substantially aligned with the feeding element 110 and the antenna pattern 30. In some embodiments, the antenna pattern 30 is disposed outside the waveguide component 20. In some embodiments, the antenna pattern 30 is spaced apart from the waveguide component 20. In some embodiments, the antenna pattern 30 and the feeding element 110 are located at opposite ends of the waveguide component 20. In some embodiments, a projection of the antenna pattern 30 on the substrate 10 is within a projection of the waveguide channel 20C on the substrate 10. In some embodiments, an area of the projection of the antenna pattern 30 on the substrate 10 is less than an area of the projection of the waveguide channel 20C on the substrate 10. In some embodiments, the antenna pattern 30 may be or include a mm-wave patch antenna.

The reflector 40 may be disposed on a side of the substrate 10 opposite to the waveguide component 20. In some embodiments, the reflector 40 is disposed on the surface 12 of the substrate 10. In some embodiments, the reflector 40 is substantially aligned with the feeding element 110, the waveguide component 20, and the antenna pattern 30. In some embodiments, a projection of the reflector 40 on the substrate 10 overlaps a projection of the waveguide channel 20C on the substrate 10. In some embodiments, the reflector 40 is configured to reflect electromagnetic waves (or signals). In some embodiments, the reflector 40 includes a metal-containing element 42 and a cavity 44 within or defined by the metal-containing element 42. In some embodiments, the meta-containing element 42 may be or include a metal casing or a metal lid. In some embodiments, the meta-containing element 42 may include gold (Au), silver (Ag), aluminum (Al), copper (Cu), or an alloy thereof. In some embodiments, the cavity 44 may be a hermetic cavity. In some embodiments, the cavity 44 is filled with a medium having a dielectric constant lower than about 2. Therefore, the high difference in acoustic impedance between the metal material of the metal-containing element 42 and the low-k medium in the cavity 44 can maximize the reflection of electromagnetic waves (or signals), and thus the performance of the reflector 40 can be enhanced. For example, the cavity 44 of the reflector 40 may be filled with air. In some embodiments, the reflector 40 is attached to the substrate 10 by solder joint (e.g. surface mount technology (SMT)). In some embodiments, the reflector 40 is attached to the substrate 10 by an adhesive layer including a low outgassing material, e.g., an epoxy adhesive material, so as to form a substantially hermetic seal between the cavity 44 and the encapsulant 60. Therefore, popcorn issues caused by air venting from the cavity 44 and being trapped inside the encapsulant 60 can be effectively mitigated or prevented.

The encapsulant 50 may encapsulate the waveguide component 20. In some embodiments, a portion of the encapsulant 50 is filled or accommodated in the waveguide channel 20C of the waveguide component 20. In some embodiments, the encapsulant 50 encapsulates the surface 11 of the substrate 10. In some embodiments, the antenna pattern 30 is disposed on the encapsulant 50. In some embodiments, the antenna pattern 30 is spaced apart from the waveguide component 20 by the encapsulant 50. The encapsulant 50 may include an epoxy resin having fillers, a molding compound (e.g., an epoxy molding compound or other molding compound), polyimide, a phenolic compound or material, a material with a silicone dispersed therein, or a combination thereof.

The electronic component 80 may be disposed on the substrate 10. In some embodiments, the electronic component 80 is disposed on the surface 12 of the substrate 10. In some embodiments, the electronic component 80 may be an active component, such as an integrated circuit (IC) chip or a die, for example, a radio frequency IC (RFIC). In some embodiments, the electronic component 80 is electrically connected to the substrate 10 by flip-chip (FC) bonding through conductive structures 82, such as conductive adhesives, conductive pads, conductive bumps, UBMs (under bump metallurgies) or the like. In some embodiments, the electronic component 80 is electrically connected to the feeding element 110 of the substrate 10. In some embodiments, the electronic component 80 is electrically coupled to the antenna pattern 30. The feeding element 110 is configured to transmit an antenna feed signal from the electronic component 20 to electrically couple to the antenna pattern 30.

The connection elements 70 may be disposed on the substrate 10. In some embodiments, the connection elements 70 are disposed on the surface 12 of the substrate 10. In some embodiments, the connection elements 70 are electrically connected to the substrate 10. In some embodiments, the electronic component 80 is configured to electrically connect with the feeding element 110 and the connection element 70. In some embodiments, the connection elements 70 may be or include solder balls, including a controlled collapse chip connection (C4) bump, a ball grid array (BGA) or a land grid array (LGA). In some embodiments, the material of the connection elements 70 may include a solder material such as Sn, Pb, Ag, Cu, or an alloy thereof. In some embodiments, the connection element 70 is configured to connect to an external device.

The encapsulant 60 may encapsulate the reflector 40. In some embodiments, the encapsulant 60 encapsulates the surface 12 of the substrate 10. In some embodiments, the encapsulant 60 encapsulates the reflector 40, the electronic component 80, and portions of the connection elements 70. In some embodiments, a portion of the connection element 70 is exposed from the encapsulant 60. In some embodiments, the encapsulants 50 and 60 are disposed on two opposite surfaces (e.g., the surfaces 11 and 12) of the substrate 10. In some embodiments, a lateral surface of the encapsulant 50 is substantially coplanar with a lateral surface of the encapsulant 60. The material of the encapsulant 60 may be similar to that of the encapsulant 50, such that the description thereof is omitted hereinafter.

In comparative embodiments, an antenna pattern is formed on a flexible printed circuit (FPC) forming an FPC antenna, and the FPC antenna is laminated onto a substrate which includes feeding port interconnection. As a result, while the tolerance for assembling packages may be at least 10 μm or more, a lamination shift may occur between the FPC antenna and the feeding port, which can significantly reduce the radiation gain of the antenna.

According to some embodiments of the present disclosure, with a waveguide component aligning with a feeding element and an antenna pattern rather than a laminated FPC antenna, the aforesaid lamination shift can be mitigated or prevented, and thus the radiation gain of the antenna pattern can be increased.

FIG. 1A illustrates a cross-sectional view of a semiconductor device package 1A, in accordance with some embodiments of the present disclosure. The semiconductor device package 1A is similar to the semiconductor device package 1 in FIG. 1, and the differences therebetween are described as follows.

In some embodiments, the semiconductor device package 1A does not include an encapsulant (e.g., the encapsulant 60 shown in FIG. 1) encapsulating the reflector 40. In some embodiments, the electronic component 80 is electrically connected to the substrate 10 by flip-chip (FC) bonding through conductive structures 82 with an underfill 84 covering the conductive structures 82. In some embodiments, the cavity 44 of the reflector 40 is filled with air. With the design of the reflector 40 not encapsulated by an encapsulant, therefore, popcorn issues caused by air venting from the cavity 44 and being trapped inside a structure or layer covering the reflector 40 can be effectively mitigated or prevented.

FIG. 2 illustrates a cross-sectional view of a semiconductor device package 2, in accordance with some embodiments of the present disclosure. The semiconductor device package 2 is similar to the semiconductor device package 1 in FIG. 1, and the differences therebetween are described as follows.

In some embodiments, the feeding element 110 is embedded in the substrate 10. In some embodiments, the feeding element 110 is in proximity to or adjacent to the surface 11 of the substrate 10.

In some embodiments, the cavity 44 is filled with a low-k dielectric material. In some embodiments, the low-k dielectric material may have a dielectric constant lower than about 2. In some embodiments, the low-k dielectric material may have a dielectric constant lower than about 1.5. The low-k dielectric material may include flowable oxide (FOX), borosilicate glass (BSG), fluorosilicate glass (FSG), phosphosilicate glass (PSG), borophosphosilicate glass (BPSG), undoped silicate glass (USG), plasma-enhanced tetraethylorthosilicate (PE-TEOS), high density plasma (HDP) oxide, plasma enhanced oxide (PEOX), or a combination thereof. Therefore, popcorn issues caused by air venting from the cavity 44 and being trapped inside the encapsulant 60 can be effectively mitigated or prevented.

FIG. 3A illustrates a cross-sectional view of a portion of a semiconductor device package, in accordance with some embodiments of the present disclosure. In some embodiments, FIG. 3A illustrates a portion including the feeding element 110, the waveguide component 20, and the antenna pattern 30. FIG. 3A has been simplified for a better understanding of the aspects of the present disclosure.

In some embodiments, a projection of the waveguide component 20 on the substrate 10 is around the periphery of a projection of the antenna pattern 30 on the substrate 10. In some embodiments, a projection of the waveguide component 20 on the substrate 10 surrounds a projection of the antenna pattern 30 on the substrate 10. In some embodiments, a projection of the waveguide channel 20C of the waveguide component 20 on the substrate 10 overlaps a projection of the antenna pattern 30 on the substrate 10. In some embodiments, a projection of the waveguide component 20 on the substrate 10 surrounds a projection of a feed portion of the feeding element 110 on the substrate 10. In some embodiments, a projection of the antenna pattern 30 on the substrate 10 overlaps a projection of a feed portion of the feeding element 110 on the substrate 10. In some embodiments, the waveguide component 20 includes an enclosed wall defining an enclosed waveguide channel 20C. In some embodiments, a projection of a feed portion of the feeding element 110 on the substrate 10 is within a projection of the waveguide channel 20C on the substrate 10.

FIG. 3B illustrates a cross-sectional view of a portion of a semiconductor device package, in accordance with some embodiments of the present disclosure. In some embodiments, FIG. 3B illustrates a portion including the feeding element 110, the waveguide component 20, and the antenna pattern 30. FIG. 3B has been simplified for a better understanding of the aspects of the present disclosure. The structure illustrated in FIG. 3B is similar to the structure illustrated in FIG. 3A, and the differences therebetween are described as follows.

In some embodiments, the waveguide component 20 includes a plurality of conductive structures 22 spaced apart from each other. In some embodiments, adjacent conductive structures 22 may be separated by a distance (e.g., by distances D1 and D1'). In some embodiments, a distance (e.g., the distance D1) between two adjacent conductive structures 22 may be different from a distance (e.g., the distance D1') between two other adjacent conductive structures 22. In some embodiments, the distance (e.g., the distances D1 and D1') between the adjacent conductive structures 22 is arranged less than a wavelength of an electromagnetic wave configured for coupling the antenna pattern 30 or the feeding element 110. In some embodiments, the distance (e.g., the distances D1 and D1') between the adjacent conductive structures 22 is less than a wavelength of an electromagnetic wave propagating through the waveguide component 20. In some embodiments, the conductive structures 22 may include conductive plates, such as metal plates.

FIG. 3C illustrates a cross-sectional view of a portion of a semiconductor device package, in accordance with some embodiments of the present disclosure. In some embodiments, FIG. 3C illustrates a portion including the feeding element 110, the waveguide component 20, and the antenna pattern 30. FIG. 3C has been simplified for a better understanding of the aspects of the present disclosure. The structure illustrated in FIG. 3C is similar to the structure illustrated in FIG. 3B except that, for example, the conductive structures 22 may include conductive pillars, such as metal pillars.

Figure 4:
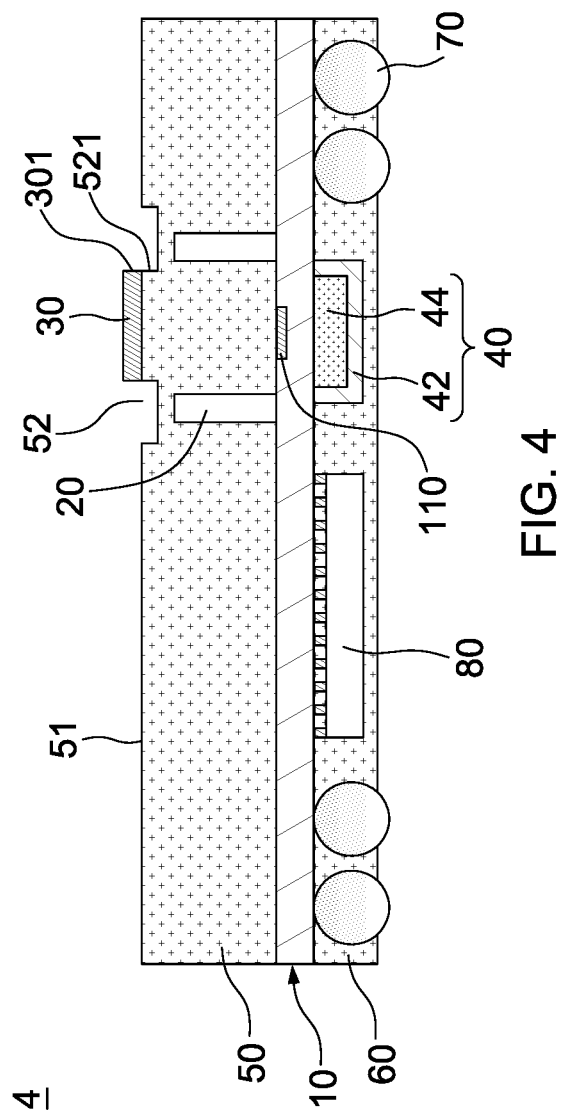
FIG. 4 illustrates a cross-sectional view of a semiconductor device package, in accordance with some embodiments of the present disclosure.

FIG. 4 illustrates a cross-sectional view of a semiconductor device package 4, in accordance with some embodiments of the present disclosure. The semiconductor device package 4 is similar to the semiconductor device package 2 in FIG. 2 except that, for example, the encapsulant 50 has a different structure.

In some embodiments, the encapsulant 50 includes a recess 52 adjacent to the antenna pattern 30. In some embodiments, the recess 52 is recessed from an upper surface 51 of the encapsulant 50. In some embodiments, the recess 52 surrounds the antenna pattern 30. In some embodiments, an edge 301 of the antenna pattern 30 may be substantially aligned with a sidewall 521 of the recess 52 of the encapsulant 50. In some embodiments, the recess 52 is directly above the waveguide component 20. In some embodiments, the antenna pattern 30 is spaced apart from the waveguide component 20 by the recess 52 of the encapsulant 50.

FIG. 5A illustrates a cross-sectional view of a semiconductor device package 5A, in accordance with some embodiments of the present disclosure. The semiconductor device package 5A is similar to the semiconductor device package 1 in FIG. 1, and the differences therebetween are described as follows.

In some embodiments, the metal-containing element 42 of the reflector 40 further includes a dielectric structure 46 and a metal layer 48. In some embodiments, the dielectric structure 46 includes the cavity 44. In some embodiments, the cavity 44 may be a hermetic cavity. In some embodiments, the cavity 44 is filled with air or a low-k dielectric material. In some embodiments, the metal layer 48 is formed on an inner surface of the cavity 44. The metal layer 48 may be formed by a metallization operation on the inner surface of the cavity 44. In some embodiments, the metal layer 48 may include Au, Ag, Al, Cu, or an alloy thereof. In some embodiments, the dielectric structure 46 may include a polymer material (e.g., a liquid crystal polymer (LCP) or an encapsulant including a material similar to that of the encapsulant 50, and thus the dielectric structure 46 is able to increase compatibility between the reflector 40 and the encapsulant 60. In some embodiments, the dielectric structure 46 and the encapsulant 60 may include the same or different materials. In some embodiments, the reflector 40 is attached to the substrate 10 by solder joint. In some embodiments, the reflector 40 is attached to the substrate 10 by an adhesive layer including a low outgassing material, e.g., an epoxy adhesive material, so as to form a substantially hermetic seal between the cavity 44 and the dielectric structure 46 and/or the encapsulant 60. Therefore, popcorn issues caused by air venting from the cavity 44 and being trapped inside the dielectric structure 46 and/or the encapsulant 60 can be effectively mitigated or prevented.

FIG. 5B illustrates a cross-sectional view of a semiconductor device package 5B, in accordance with some embodiments of the present disclosure. The semiconductor device package 5B is similar to the semiconductor device package 5A in FIG. 5A, and the differences therebetween are described as follows.

In some embodiments, the reflector 40 may include a through hole 49 passing through the metal-containing element 42. In some embodiments, the through hole 49 passes through the metal layer 48 and the dielectric structure 46. In some embodiments, the cavity 44 is filled with air and connected to an external environment through the through hole 49. In some embodiments, the through hole 49 serves as an outgassing hole for the cavity 44 of the reflector 40. Therefore, popcorn issues caused by air venting from the cavity 44 and being trapped inside a structure or layer covering the reflector 40 can be effectively mitigated or prevented. In some embodiments, a size D2 of the through hole 49 is less than a wavelength of an electromagnetic wave propagating through the waveguide component 20. In some embodiments, a size D2 of the through hole 49 is less than a wavelength of an electromagnetic wave reflected by the reflector 40.

FIG. 6 illustrates a cross-sectional view of a semiconductor device package 6, in accordance with some embodiments of the present disclosure. The semiconductor device package 6 is similar to the semiconductor device package 2 in FIG. 2 except that, for example, the antenna pattern 30 has a different arrangement.

In some embodiments, the encapsulant 50 further encapsulates the antenna pattern 30. In some embodiments, an upper surface 21 of the waveguide component 20 is exposed from the encapsulant 50. In some embodiments, the upper surface 21 of the waveguide component 20 is substantially coplanar with the upper surface 51 of the encapsulant 50. In some embodiments, an upper surface 31 of the antenna pattern 30 is exposed from the encapsulant 50. In some embodiments, the upper surface 31 of the antenna pattern 30 is substantially coplanar with the upper surface 51 of the encapsulant 50. In some embodiments, the antenna pattern 30 is disposed within the waveguide component 20. In some embodiments, the waveguide component 20 surrounds the antenna pattern 30. In some embodiments, the antenna pattern 30 is spaced apart from the waveguide component 20 by the encapsulant 50.

FIG. 7A illustrates a cross-sectional view of a semiconductor device package 7A, in accordance with some embodiments of the present disclosure. The semiconductor device package 6 is similar to the semiconductor device package 2 in FIG. 2, and the differences therebetween are described as follows.

In some embodiments, the semiconductor device package 7A further includes an element 90 physically separating the waveguide component 20 from the antenna pattern 30. In some embodiments, the waveguide component 20 is spaced apart from the antenna pattern 30 by the element 90. In some embodiments, the element 90 may be a non-conductive element connected to the waveguide component 20 and the antenna pattern 30. In some embodiments, the semiconductor device package 7A does not include an encapsulant (e.g., the encapsulant 50) encapsulating the waveguide component 20. In some embodiments, the antenna pattern 30 is spaced apart from the waveguide component 20 by an air gap. In some embodiments, the antenna pattern 30 is disposed within the waveguide component 20. In some embodiments, the waveguide component 20 surrounds the antenna pattern 30. In some embodiments, the element 90 includes a non-conductive cap, a non-conductive lid, a non-conductive layer, or the like. In some embodiments, the element 90 includes an insulating material. The insulating material may include, for example, but is not limited to, one or more organic materials (e.g., phosphoric anhydride (PA), polyimide (PI), polybenzoxazole (PBO), epoxy, an epoxy-based material, or the like), or one or more inorganic materials (e.g., silicon, a glass, ceramic, oxide, nitride, oxynitride, or the like). According to some embodiments of the present disclosure, the element 90 can prevent an electrical short circuit between the waveguide component 20 and the antenna pattern 30.

FIG. 7B1 illustrates a top view of a portion of a semiconductor device package, in accordance with some embodiments of the present disclosure. In some embodiments, FIG. 7B1 illustrates a portion including the waveguide component 20, the antenna pattern 30, and the element 90. FIG. 7B1 has been simplified for a better understanding of the aspects of the present disclosure.

In some embodiments, the element 90 includes a plurality of ribs each connecting the antenna pattern 30 to the waveguide component 20. In some embodiments, the element 90 is between the antenna pattern 30 and the waveguide component 20.

FIG. 7B2 illustrates a cross-sectional view of a portion of a semiconductor device package, in accordance with some embodiments of the present disclosure. In some embodiments, FIG. 7B2 illustrates a cross-sectional view along the cross-sectional line 7B1-7B 1' in FIG. 7B1. FIG. 7B2 has been simplified for a better understanding of the aspects of the present disclosure.

In some embodiments, a thickness of the ribs of the element 90 is less than a thickness of the antenna pattern 30. In some embodiments, upper surfaces 91 of the ribs of the element 90 are substantially coplanar with an upper surface 21 of the waveguide component 20. In some embodiments, the upper surfaces 91 of the ribs of the element 90 are substantially coplanar with an upper surface 31 of the antenna pattern 30.

FIG. 7B3 illustrates a top view of a portion of a semiconductor device package, in accordance with some embodiments of the present disclosure. In some embodiments, FIG. 7B3 illustrates a portion including the waveguide component 20, the antenna pattern 30, and the element 90. FIG. 7B3 has been simplified for a better understanding of the aspects of the present disclosure. The structure illustrated in FIG. 7B3 is similar to the structure illustrated in FIG. 7B1 except that, for example, the element 90 has a different structure.

In some embodiments, the element 90 includes a plurality of ribs each connecting the antenna pattern 30 to the waveguide component 20. In some embodiments, the element 90 is between the antenna pattern 30 and the waveguide component 20.

FIG. 7B4 illustrates a cross-sectional view of a portion of a semiconductor device package, in accordance with some embodiments of the present disclosure. In some embodiments, FIG. 7B4 illustrates a cross-sectional view along the cross-sectional line 7B3-7B3' in FIG. 7B3. FIG. 7B4 has been simplified for a better understanding of the aspects of the present disclosure.

In some embodiments, the ribs of the element 90 are disposed on an upper surface 21 of the waveguide component 20 and an upper surface 31 of the antenna pattern 30.

Figure 8:
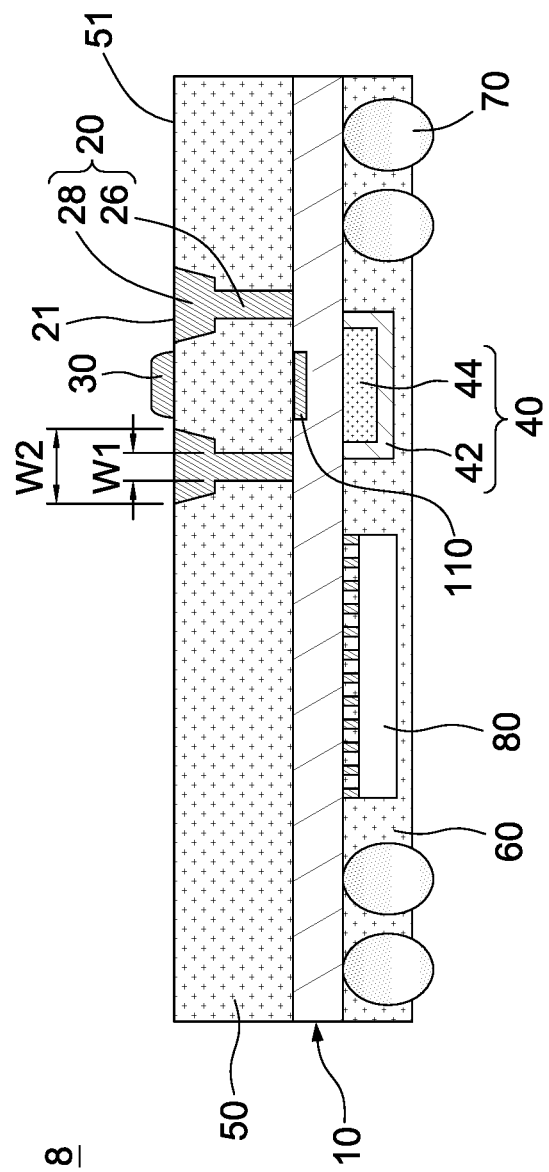
FIG. 8 illustrates a cross-sectional view of a semiconductor device package, in accordance with some embodiments of the present disclosure.

FIG. 8 illustrates a cross-sectional view of a semiconductor device package 8, in accordance with some embodiments of the present disclosure. The semiconductor device package 8 is similar to the semiconductor device package 2 in FIG. 2, and the differences therebetween are described as follows.

In some embodiments, the waveguide component 20 includes a portion 26 connected to the substrate 10 and a portion 28 on the portion 26. In some embodiments, the portion 28 of the waveguide component 20 has a tapered cross-sectional shape. In some embodiments, the portion 28 of the waveguide component 20 tapers towards the substrate 10. In some embodiments, the portion 28 of the waveguide component 20 tapers towards the portion 26 of the waveguide component 20. In some embodiments, the portion 26 of the waveguide component 20 has a width W1, and the portion 28 of the waveguide component 20 has a width W2 greater than the width W1. In some embodiments, the portion 26 of the waveguide component 20 has a constant width W1, and the portion 28 of the waveguide component 20 has a width W2 decreasing towards the portion 26. The tapered waveguide component 20 can focus the electromagnetic wave to the antenna pattern 30 so as to enhance the gain performance.

In some embodiments, the waveguide component 20 includes a stepped wall structure including the portions 26 and 28. In some embodiments, the upper surface 21 of the waveguide component 20 is substantially coplanar with the upper surface 51 of the encapsulant 50. In some embodiments, the antenna pattern 30 is disposed on the upper surface 51 of the encapsulant 50.

In some embodiments, the encapsulant 50 (also referred to as "the dielectric structure") may be formed of or include a dielectric material, such as an oxide material (e.g., silicon oxide) or a nitride material (e.g., silicon nitride or silicon oxynitride). In some embodiments, the waveguide component 20 is embedded in the encapsulant 50 (or the dielectric structure).

FIG. 9A, FIG. 9B, FIG. 9C, FIG. 9D, FIG. 9E, FIG. 9F, and FIG. 9G illustrate one or more stages of a method of manufacturing a semiconductor device package 1B in accordance with some embodiments of the present disclosure.

Referring to FIG. 9A, a substrate 10 including a feeding element 110 is provided, and a waveguide component 20 is formed or disposed over a surface 11 of the substrate 10. In some embodiments, the waveguide component 20 may be or include a pre-formed metal member having two open ends. In some embodiments, the waveguide component 20 is substantially aligned with the feeding element 110

Referring to FIG. 9B, the waveguide component 20 is encapsulated by an encapsulant 50'. In some embodiments, the encapsulant 50' covers the waveguide component 20 and the surface 11 of the substrate 10.

Referring to FIG. 9C, a thinning operation is performed on the encapsulant 50' to form an encapsulant 50 having a reduced thickness compared to that of the encapsulant 50'. The thinning operation may be performed by a grinding process.

Referring to FIG. 9D, a reflector 40 and an electronic component 80 are disposed or formed on a side of the substrate 10 opposite to the waveguide component 20. In some embodiments, the reflector 40 and the electronic component 80 are disposed or formed on a surface 12 opposite to the surface 11 of the substrate 10. In some embodiments, the reflector 40 may be or may include a pre-formed metal-containing element 42 having a cavity 44 filled with a medium, such as a low-k dielectric material. In some embodiments, the reflector 40 is attached to the substrate 10 by solder joint or an adhesive layer including a low outgassing material. In some embodiments, the electronic component 80 is electrically connected to the substrate 10 (e.g., the feeding element 110), and the electrical connection may be attained by way of SMT and flip-chip techniques.

Referring to FIG. 9E, connection elements 70' are disposed on the surface 12 of the substrate 10, and the reflector 40, the electronic component 80, and the connection elements 70' are encapsulated by an encapsulant 60'. In some embodiments, the connection elements 70' may be or may include solder balls. In some embodiments, the encapsulant 60' covers the reflector 40, the electronic component 80, the connection elements 70', and the surface 12 of the substrate 10.

Referring to FIG. 9F, a thinning operation is performed on the encapsulant 60' to form an encapsulant 60 having a reduced thickness compared to that of the encapsulant 60' and expose portions of the connection elements 70'. The thinning operation may be performed by a grinding process. In some embodiments, portions of the connection elements 70' are removed by the thining operation to expose upper surfaces of the thinned connection elements 70'.

Figure 9G:
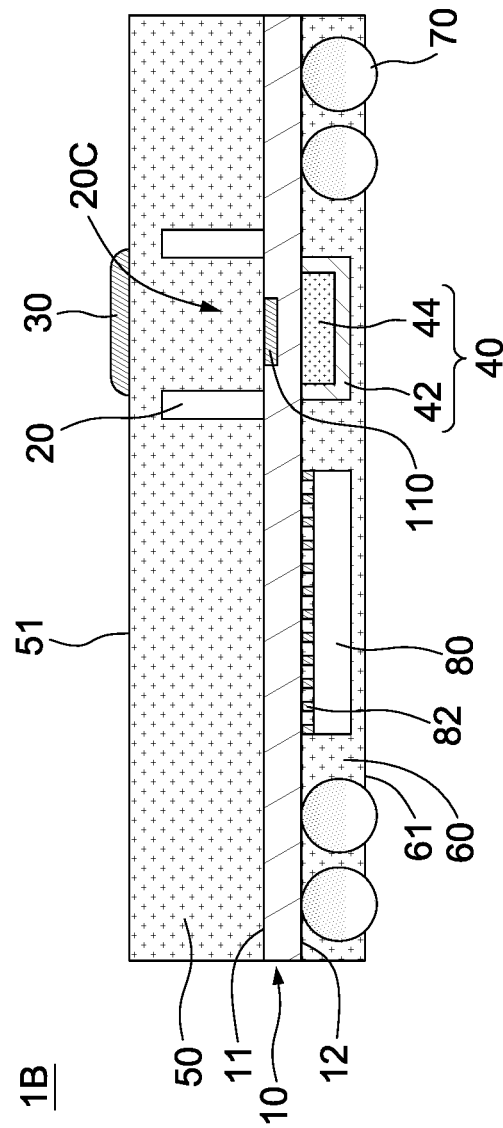

Referring to FIG. 9G, a solder material is further formed on the exposed upper surfaces of the thinned connection elements 70' to form connection elements 70 having portions protruded out of a surface 61 of the encapsulant 60, and an antenna pattern 30 is formed over the substrate 10. In some embodiments, a laser ablation operation may be performed on portions of the encapsulant 60 to open up more spaces for applying the solder material to form the connection elements 70. In some embodiments, the antenna pattern 30 is formed on the upper surface 51 of the encapsulant 50. In some embodiments, the waveguide component 20 is substantially aligned with the feeding element 110 and the antenna pattern 30. The antenna pattern 30 may be formed by deposition (e.g., a CVD process or a PVD process) or sputtering. As such, a semiconductor device package 1B is formed.

Figure 10C:
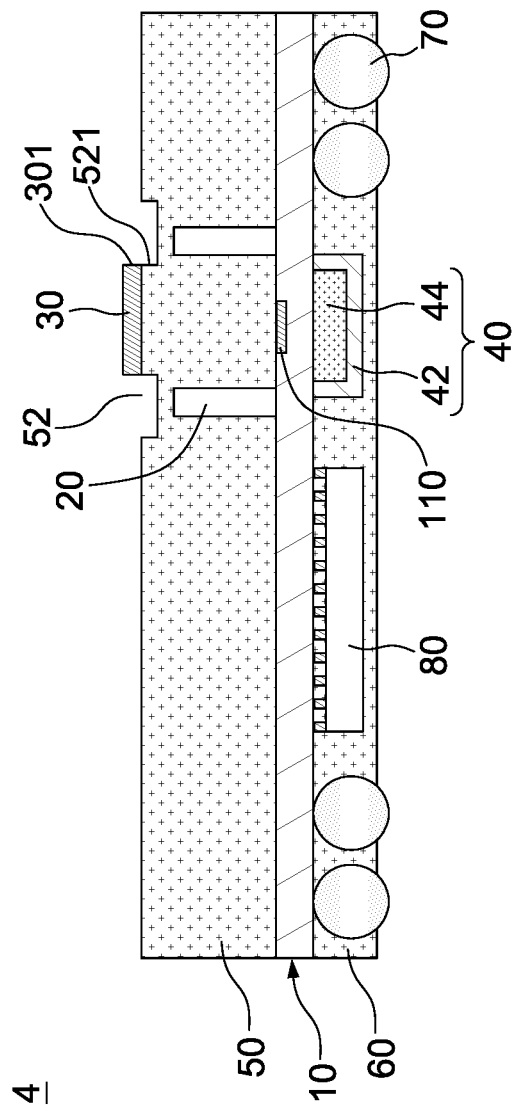

FIG. 10A, FIG. 10B, and FIG. 10C illustrate one or more stages of a method of manufacturing a semiconductor device package 4 in accordance with some embodiments of the present disclosure.

Referring to FIG. 10A, operations similar to those illustrated in FIGS. 9A-9G are performed, except that a conductive layer 30A is formed on the upper surface 51 of the encapsulant 50 rather than the antenna pattern 30 illustrated in FIG. 9G, to form a structure illustrated in FIG. 10A. In some embodiments, the conductive layer 30A may be formed by deposition (e.g., a CVD process or a PVD process) or sputtering. The conductive layer 30A may be or may include a metal layer. In some embodiments, the conductive layer 30A is above the waveguide component 20. In some embodiments, the conductive layer 30A covers the waveguide component 20 from a top view perspective. In some embodiments, a projection of the waveguide component 20 on the substrate 10 is within a projection of the conductive layer 30A on the substrate 10.

Referring to FIG. 10B, a removal operation is performed on the encapsulant 50 adjacent to the antenna pattern 30. In some embodiments, the removal operation is performed on the upper surface 51 of the encapsulant 50. In some embodiments, the removal operation is performed on a portion of the encapsulant 50 directly above the waveguide component 20. In some embodiments, the removal operation is performed by applying a laser onto the encapsulant 50.

Referring to FIG. 10C, a recess 52 is formed in the encapsulant 50 and adjacent to the antenna pattern 30 by the removal operation. In some embodiments, the removal operation includes removing a portion of the antenna pattern 30 to align an edge 301 of the antenna pattern 30 with a sidewall 521 of the recess 52 of the encapsulant 50. As such, the semiconductor device package 4 is formed.

With the aforesaid operations in accordance with some embodiments of the present disclosure, the antenna pattern 30 may be formed of a relatively large area at a first step, and then the precise position, area, and shape of the antenna pattern 30 can be defined by the following removal operation as a second step. Therefore, the alignment tolerance for forming the antenna pattern 30 in the first step can be increased, simplifying the manufacturing process and increasing yield, while maintaining satisfactory the accuracy of the final position, area, and shape of the antenna pattern 30.

FIG. 11A, FIG. 11B, FIG. 11C, and FIG. 11D illustrate one or more stages of a method of manufacturing a semiconductor device package 5A in accordance with some embodiments of the present disclosure.

Referring to FIG. 11A, operations similar to those illustrated in FIGS. 9A-9C are performed to form a waveguide component 20 on a surface 11 of a substrate 10 and encapsulate the waveguide component 20 by an encapsulant 50, and operations similar to those illustrated in FIG. 9G are performed to form an antenna pattern 30 on the encapsulant 50.

Next, still referring to FIG. 11A, connection elements 70', an electronic component 80, and a structure 42A including a dielectric structure 46' having a cavity 44 and a metal layer 48 formed on an inner surface of the cavity 44 are disposed on a surface 12 of the substrate 10. In some embodiments, the structure 42A is substantially aligned with the feeding element 110 and the antenna pattern 30. In some embodiments, the structure 42A including the dielectric structure 46' and the metal layer 48 may be a pre-formed structure. The metal layer 48 may be formed by a metallization operation on the inner surface of the cavity 44. In some embodiments, the structure 42A is attached to the substrate 10 by solder joint or an adhesive layer including a low outgassing material.

Referring to FIG. 11B, the structure 42A, the electronic component 80, and the connection elements 70' are encapsulated by an encapsulant 60'. In some embodiments, the connection elements 70' may be or may include solder balls. In some embodiments, the encapsulant 60' covers the reflector 40, the electronic component 80, the connection elements 70', and the surface 12 of the substrate 10.

Referring to FIG. 11C, a thinning operation is performed on the encapsulant 60' to form an encapsulant 60 having a reduced thickness compared to that of the encapsulant 60' and expose portions of the connection elements 70'. The thinning operation may be performed by a grinding process. In some embodiments, portions of the connection elements 70' are removed by the thinning operation to expose upper surfaces of the thinned connection elements 70'. In some embodiments, a portion of the dielectric structure 46' is removed by the thinning operation to form a dielectric structure 46 having an upper surface exposed from the encapsulant 60.

Referring to FIG. 11D, a solder material is further formed on the exposed upper surfaces of the thinned connection elements 70' to form connection elements 70 having portions protruded out of a surface 61 of the encapsulant 60. As such, the semiconductor device package 5A is formed.

FIG. 12A, FIG. 12B, FIG. 12C, and FIG. 12D illustrate one or more stages of a method of manufacturing a semiconductor device package 5B in accordance with some embodiments of the present disclosure.

Referring to FIG. 12A, operations similar to those illustrated in FIGS. 9A-9C are performed to form a waveguide component 20 on a surface 11 of a substrate 10 and encapsulate the waveguide component 20 by an encapsulant 50, and operations similar to those illustrated in FIG. 9G are performed to form an antenna pattern 30 on the encapsulant 50.

Next, still referring to FIG. 12A, a structure 42B including a dielectric structure 46' having a cavity 44, a metal layer 48 formed on an inner surface of the cavity 44, and a through hole 49 passing through the dielectric structure 46' and the metal layer 48 is provided, and connection elements 70', an electronic component 80, and the structure 42B are disposed on a surface 12 of the substrate 10. In some embodiments, the structure 42B is substantially aligned with the feeding element 110 and the antenna pattern 30. In some embodiments, the structure 42B including the dielectric structure 46', the metal layer 48 and the through hole 49 may be a pre-formed structure. In some embodiments, the structure 42B is attached to the substrate 10 by solder joint or an adhesive layer.

Referring to FIG. 12B, the structure 42B, the electronic component 80, and the connection elements 70' are encapsulated by an encapsulant 60'. In some embodiments, a portion of the encapsulant 60' may be within a portion of the through hole 49 so as to seal the through hole 49. In some embodiments, the connection elements 70' may be or may include solder balls. In some embodiments, the encapsulant 60' covers the reflector 40, the electronic component 80, the connection elements 70', and the surface 12 of the substrate 10.

Referring to FIG. 12C, a thinning operation is performed on the encapsulant 60' to form an encapsulant 60 having a reduced thickness compared to that of the encapsulant 60' and expose portions of the connection elements 70'. The thinning operation may be performed by a grinding process. In some embodiments, portions of the connection elements 70' are removed by the thing operation to expose upper surfaces of the thinned connection elements 70'. In some embodiments, a portion of the dielectric structure 46' is removed by the thinning operation to form a dielectric structure 46 having an upper surface exposed from the encapsulant 60. In some embodiments, the portion of the encapsulant 60' within the through hole 49 is removed by the thinning operation to open up the through hole 49.

Referring to FIG. 12D, a solder material is further formed on the exposed upper surfaces of the thinned connection elements 70' to form connection elements 70 having portions protruded out of a surface 61 of the encapsulant 60. As such, the semiconductor device package 5B is formed.

FIG. 13A, FIG. 13B, FIG. 13C, FIG. 13D, FIG. 13E, and FIG. 13F illustrate one or more stages of a method of manufacturing a semiconductor device package 6 in accordance with some embodiments of the present disclosure.

Referring to FIG. 13A, an integrated structure 20A including a waveguide component 20 and an antenna pattern 30 connected to the waveguide component 20 is disposed on a surface 11 of the substrate 10. In some embodiments, the integrated structure 20A further includes a connection element 20A1 connecting the waveguide component 20 to the antenna pattern 30. In some embodiments, the integrated structure 20A is disposed on a surface 11 of the substrate 10 and substantially aligned with the feeding element 110 of the substrate 10. In some embodiments, the integrated structure 20A and the substrate 10 define a cavity 20C'.

Referring to FIG. 13B, the integrated structure 20A is encapsulated by an encapsulant 50'. In some embodiments, the encapsulant 50' covers the integrated structure 20A and the surface 11 of the substrate 10. In some embodiments, a portion of the encapsulant 50' is filled in the cavity 20C'.

Referring to FIG. 13C, a portion of the integrated structure 20A is removed to separate the waveguide component 20 from the antenna pattern 30 and expose an upper surface 21 of the waveguide component 20 and an upper surface 31 of the antenna pattern 30. In some embodiments, the waveguide component 20 may be separated from the antenna pattern 30 by a grinding process. In some embodiments, the grinding process removes the connection element 20A1 and a portion of the encapsulant 50' so as to form an encapsulant 50 having a reduced thickness compared to that of the encapsulant 50'. In some embodiments, portions of the waveguide component 20 and the antenna pattern 30 may also be removed by the grinding process.

Referring to FIG. 13D, operations similar to those illustrated in FIG. 9D are performed to dispose a reflector 40 and an electronic component 80 on a surface 12 of the substrate 10.

Figure 13E:
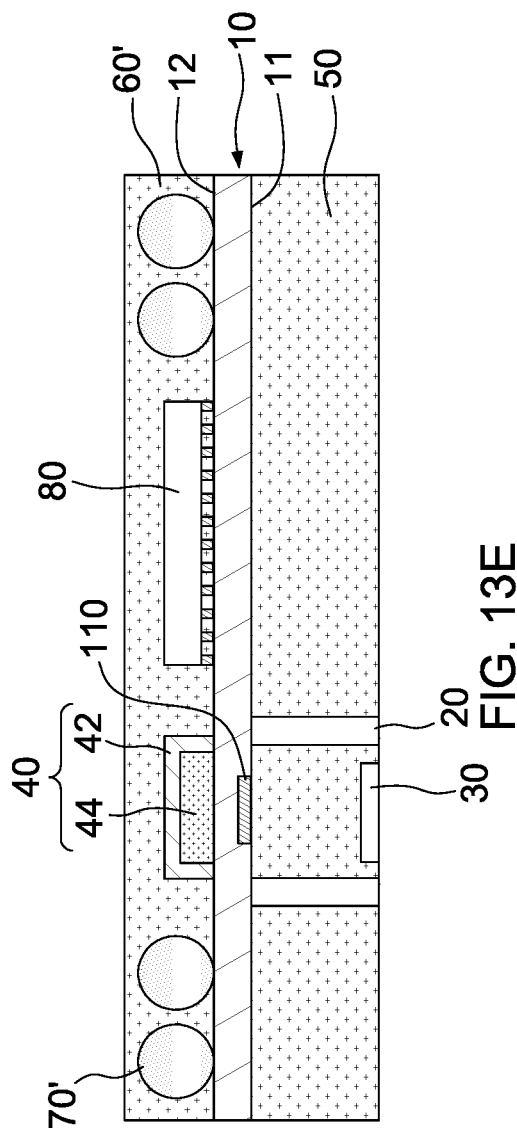

Referring to FIG. 13E, operations similar to those illustrated in FIG. 9E are performed to dispose connection elements 70' on the surface 12 of the substrate 10 and encapsulate the reflector 40, the electronic component 80, and the connection elements 70' by an encapsulant 60'.

Figure 13F:
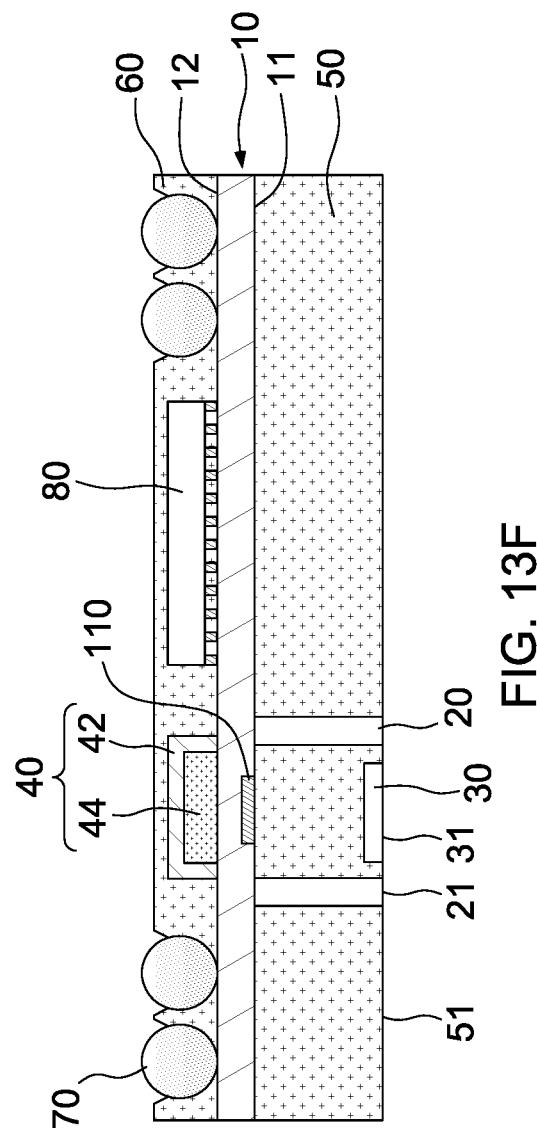

Referring to FIG. 13F, operations similar to those illustrated in FIGS. 9F-9G are performed to thin the encapsulant 60' to form an encapsulant 60 having a reduced thickness compared to that of the encapsulant 60', expose portions of the connection elements 70', and form a solder material on the exposed upper surfaces of the thinned connection elements 70' to form connection elements 70 having portions protruded out of a surface 61 of the encapsulant 60. As such, the semiconductor device package 6 is formed.

According to some embodiments of the present disclosure, with the waveguide component 20 and the antenna pattern 30 pre-formed in the integrated structure 20A, the relative positions of the waveguide component 20 and the antenna pattern 30 can be fixed without any possible shifting. In addition, the integrated structure 20A is encapsulated followed by separation to form the waveguide component 20 and the antenna pattern 30, such that the relative positions of the waveguide component 20 and the antenna pattern 30 and thus the relative positions of the antenna pattern 30 and the substrate 10 can remain fixed. Therefore, while the distance between the antenna pattern 30 the feeding element 110 of the substrate 10 is crucial to the propagation of the electromagnetic waves along the waveguide component 20, the aforesaid distance can be easily controlled at the predetermined value, and thus the radiation gain performance of the antenna pattern 30 can achieve the desired satisfactory level.

In addition, according to some embodiments of the present disclosure, the antenna pattern 30 can be formed directly by separation of the integrated structure 20A, thus deposition and/or sputtering operations for forming the antenna pattern layer can be omitted, further refining processes (e.g., trimming the shape of the antenna pattern) can also be omitted, and thus the manufacturing process can be simplified.

FIG. 14A, FIG. 14B, FIG. 14C, and FIG. 14D illustrates one or more stages of a method of manufacturing a semiconductor device package in accordance with some embodiments of the present disclosure.

Figure 14A:
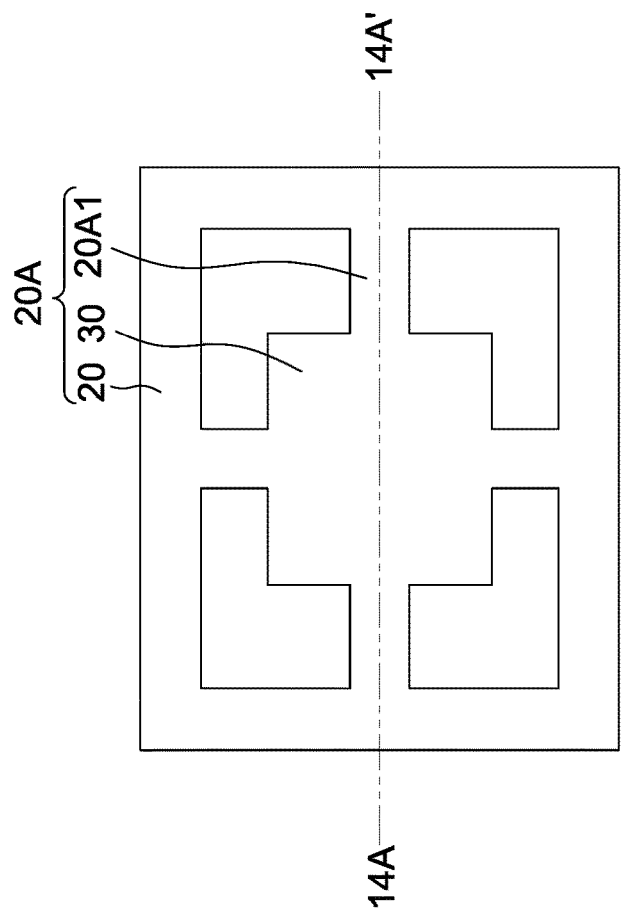
FIG. 14A, FIG. 14B, FIG. 14C, and FIG. 14D illustrates one or more stages of a method of manufacturing a semiconductor device package in accordance with some embodiments of the present disclosure.

In some embodiments, FIG. 14A illustrates a top view of the integrated structure 20A for forming the waveguide component 20 and the antenna pattern 30. In some embodiments, the connection element 20A1 includes a plurality of ribs each connecting the antenna pattern 30 to the waveguide component 20. In some embodiments, the connection element 20A1 is between the antenna pattern 30 and the waveguide component 20. In some embodiments, the integrated structure 20A is an integrally formed monolithic structure.

Figure 14B:
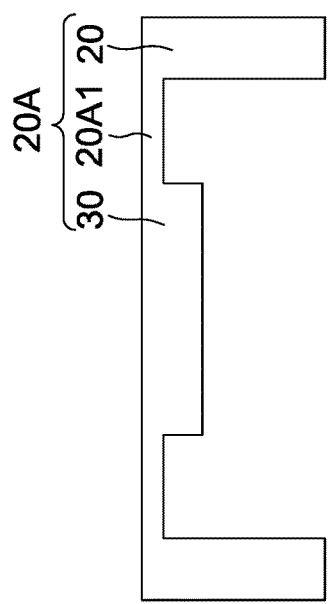

In some embodiments, FIG. 14B illustrates a cross-sectional view along the cross-sectional line 14A-14A' in FIG. 14A. In some embodiments, a thickness of the ribs of the connection element 20A1 is less than a thickness of the antenna pattern 30. In some embodiments, upper surfaces of the ribs of the connection element 20A1 are substantially coplanar with an upper surface 21 of the waveguide component 20. In some embodiments, the upper surfaces of the ribs of the connection element 20A1 are substantially coplanar with an upper surface 31 of the antenna pattern 30.

Figure 14C:
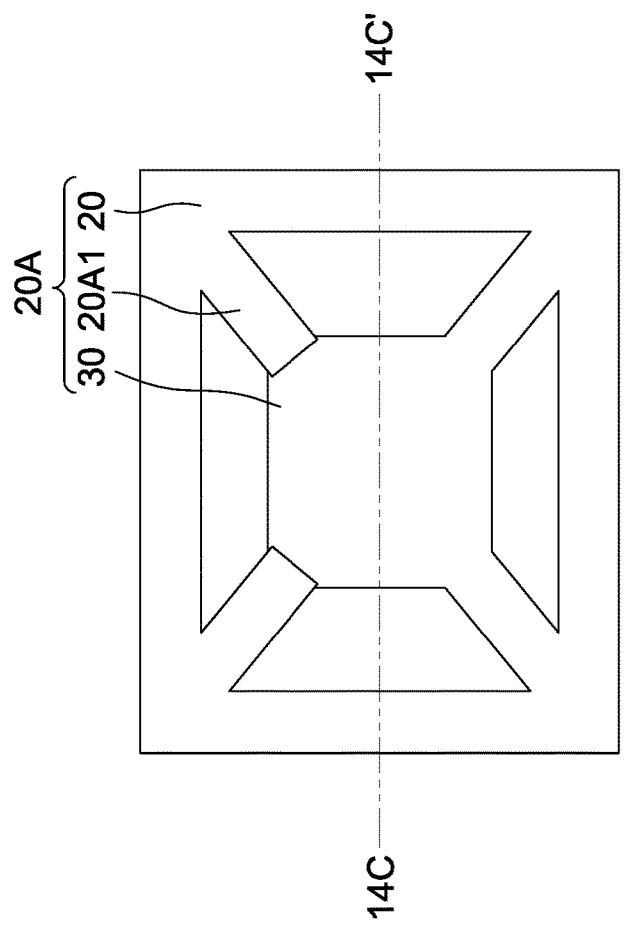
Figure 14D:
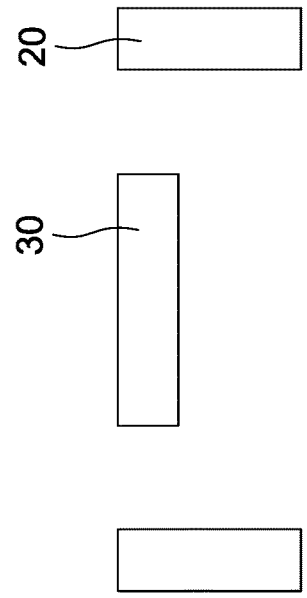

In some embodiments, FIG. 14C illustrates a top view of the integrated structure 20A for forming the waveguide component 20 and the antenna pattern 30, and FIG. 14D illustrates a cross-sectional view along the cross-sectional line 14C-14C' in FIG. 14C. The structure illustrated in FIGS. 14C-14D is similar to the structure illustrated in FIGS. 14A-14B except that, for example, the connection element 20A1 has a different structure. In some embodiments, the ribs of the connection element 20A1 connect the corners of the waveguide component 20 to the antenna pattern 30.

FIG. 15 illustrates one or more stages of a method of manufacturing a semiconductor device package 7A in accordance with some embodiments of the present disclosure.

Referring to FIG. 15, an integrated structure including a waveguide component 20 and an antenna pattern 30 connected to the waveguide component 20 by an element 90 is disposed on the surface 11 of the substrate 10. In some embodiments, the integrated structure is substantially aligned with the feeding element 110 of the substrate 10. In some embodiments, the operations illustrated in FIG. 15 may be performed prior to or after forming the reflector 40, the electronic component 80, the connection elements 70, and the encapsulant 60 on the surface 12 of the substrate 10 to form the semiconductor device structure 7A.

FIG. 16A, FIG. 16B, FIG. 16C, FIG. 16D, FIG. 16E, and FIG. 16F illustrate one or more stages of a method of manufacturing a semiconductor device package 8 in accordance with some embodiments of the present disclosure.

Figure 16A:
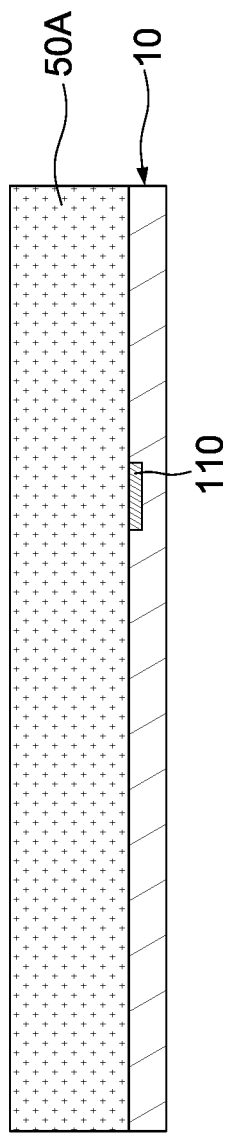

Referring to FIG. 16A, a dielectric structure 50A is formed on a surface 11 of a substrate 10 including a feeding element 110. In some embodiments, the dielectric structure 50A may include, for example, but is not limited to, one or more organic materials (e.g., PA, PI, PBO, epoxy, an epoxy-based material, or the like), or one or more inorganic materials (e.g., silicon, a glass, ceramic, oxide, nitride, oxynitride, or the like).

Figure 16B:
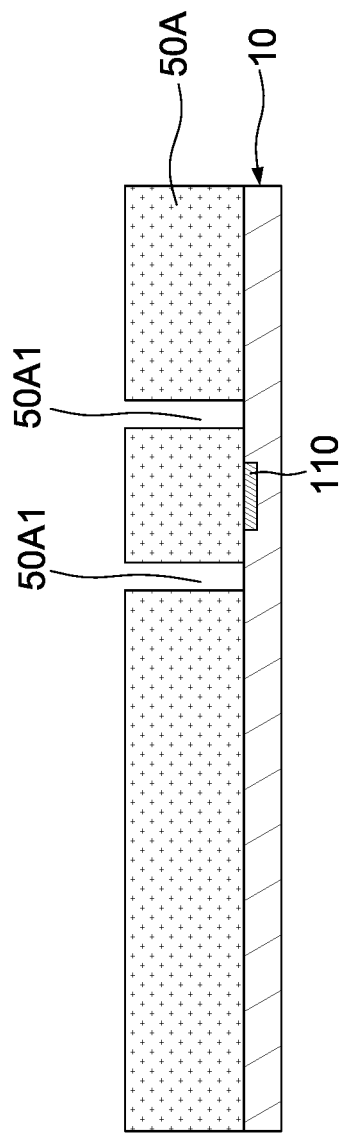

Referring to FIG. 16B, a first removal operation is performed on the dielectric structure 50A to form a trench portion 50A1 within the dielectric structure 50A. In some embodiments, the trench portion 50A1 having a constant width. The first removal operation may be performed by laser ablation or laser drilling.

Figure 16C:
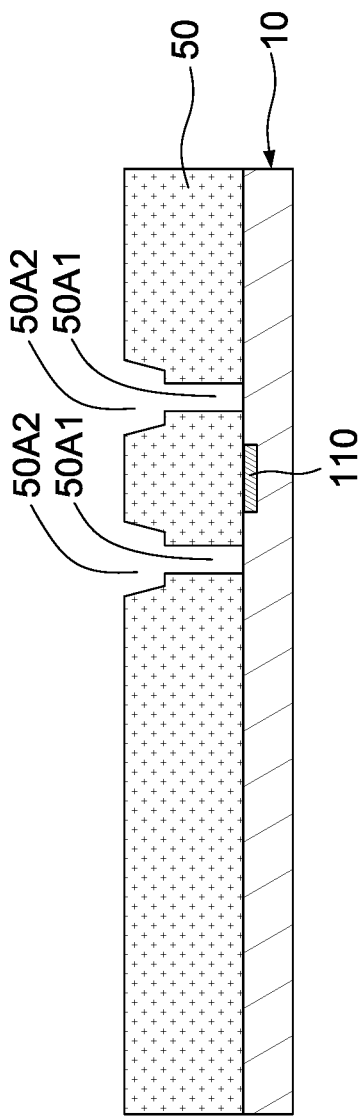

Referring to FIG. 16C, a second removal operation is performed on the dielectric structure 50A to form a trench portion 50A2 adjacent to an upper surface of the dielectric structure 50A, so as to form a trench including the trench portions 50A1 and 50A2 within the dielectric structure (i.e. the encapsulant 50). In some embodiments, the trench portion 50A2 is directly above and connected to the trench portion A1. In some embodiments, the trench portion 50A2 has a width greater than a width of the trench portion 50A1. In some embodiments, the trench portion 50A2 has a tapered cross-sectional shape. The second removal operation may be performed by laser ablation or laser drilling.

Figure 16D:
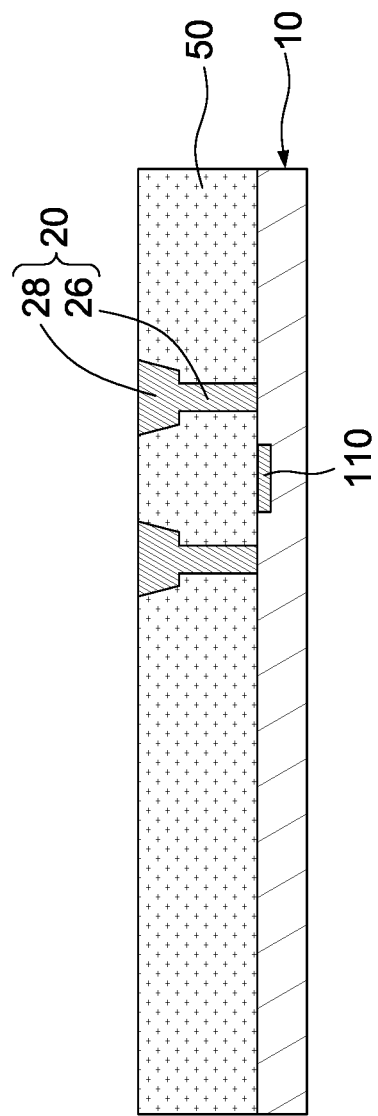

Referring to FIG. 16D, the trench is filled with a conductive material to form the waveguide component 20 with the dielectric structure (i.e., the encapsulant 50). In some embodiments, the conductive material is filled or applied from the portion 50A2 of the trench, and the portion 50A2 having a size greater than that of the portion 50A1 (i.e., the trench having a relatively wide opening end) is advantageous to the filling of the conductive material, such as increasing the filling uniformity and avoiding voids formation within the as-formed waveguide component 20.

Referring to FIG. 16E, operations similar to those illustrated in FIGS. 9D-9E are performed to dispose a reflector 40, connection elements 70', and an electronic component 80 on a surface 12 of the substrate 10, and encapsulate the reflector 40, the electronic component 80, and the connection elements 70' by an encapsulant 60'.

Referring to FIG. 16F, operations similar to those illustrated in FIGS. 9F-9G are performed to thin the encapsulant 60' to form an encapsulant 60 having a reduced thickness compared to that of the encapsulant 60', expose portions of the connection elements 70', and form a solder material on the exposed upper surfaces of the thinned connection elements 70' to form connection elements 70 having portions protruded out of a surface 61 of the encapsulant 60. As such, the semiconductor device package 8 is formed.

According to some embodiments of the present disclosure, the waveguide component 20 is formed in the trench within the encapsulant 50 (or the dielectric structure), and thus the waveguide component 20 is free from possible damage by a molding flow for forming an encapsulant covering the waveguide component 20. In addition, the trenches formed by laser technique having a relatively high alignment accuracy compared to the aligning shift tolerance of SMT technology, and thus the dimension and position accuracy of the waveguide component 20 formed by filling a conductive material in a laser trench can be increased.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm within 5 μm within 1 μm or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a substrate comprising a feeding element;
a waveguide component disposed over the substrate; and
an antenna pattern disposed over the substrate, wherein the waveguide component is substantially aligned with the feeding element and the antenna pattern,
wherein a projection of the waveguide component on the substrate is around a periphery of a projection of the antenna pattern on the substrate, and
wherein the waveguide component comprises a plurality of conductive structures spaced apart from each other.

2. The semiconductor device package of claim 1, wherein the antenna pattern is spaced apart from the waveguide component.

3. The semiconductor device package of claim 2, wherein the antenna pattern is disposed outside of the waveguide component.

4. The semiconductor device package of claim 1, further comprising a reflector disposed on a side of the substrate opposite to the waveguide component and configured to reflect electromagnetic waves.

5. The semiconductor device package of claim 4, wherein the reflector comprises a through hole connecting a cavity of the reflector to an outside of the semiconductor device package.

6. The semiconductor device package of claim 5, wherein the reflector further comprises a conductive layer on an inner surface of the cavity.

7. The semiconductor device package of claim 6, further comprising an encapsulant encapsulating the reflector, wherein a lower surface of the reflector is exposed by the encapsulant.

8. The semiconductor device package of claim 1, wherein a distance between the adjacent conductive structures is arranged less than a wavelength of an electromagnetic wave configured for coupling the antenna pattern or the feeding element.

9. The semiconductor device package of claim 1, further comprising an encapsulant encapsulating the waveguide component.

10. The semiconductor device package of claim 9, wherein the encapsulant has an upper surface spaced apart from the waveguide component by a gap.

11. A semiconductor device package, comprising:
a substrate comprising a feeding element;
a waveguide component disposed over the substrate;
an antenna pattern disposed over the substrate, wherein the waveguide component is substantially aligned with the feeding element and the antenna pattern; and
an encapsulant encapsulating the waveguide component, wherein the antenna pattern is spaced apart from the waveguide component by the encapsulant.

12. A semiconductor device package, comprising:
a substrate comprising a first surface and a second surface opposite to the first surface;
a waveguide component at least partially disposed over the first surface of the substrate;
a first encapsulant encapsulating the first surface of the substrate and the waveguide component; and
a second encapsulant encapsulating the second surface of the substrate,
wherein the waveguide component comprises a waveguide channel accommodating a portion of the first encapsulant, and
wherein a lateral surface of the first encapsulant is substantially coplanar with a lateral surface of the second encapsulant.

13. The semiconductor device package of claim 12, further comprising a connection element disposed over the second surface of the substrate and exposed from the second encapsulant, wherein the connection element is configured to connect to an external device.

14. The semiconductor device package of claim 13, further comprising an antenna pattern disposed over the first surface of the substrate, wherein the substrate comprises a feeding element, and the waveguide channel is substantially aligned with the antenna pattern and the feeding element.

15. The semiconductor device package of claim 14, further comprising a reflector disposed over the second surface of the substrate and encapsulated by the second encapsulant, wherein the reflector is substantially aligned with the feeding element.

16. The semiconductor device package of claim 14, further comprising an electronic component encapsulated by the second encapsulant and configured to electrically connect with the feeding element and the connection element.

* * * * *